US006149986A

United States Patent [19]

Shibata et al.

[11] Patent Number: 6,149,986

[45] Date of Patent: *Nov. 21, 2000

[54] METHODS FOR MANUFACTURING A SUBSTRATE FOR A LIQUID JET RECORDING HEAD, LIQUID JET RECORDING HEAD, AND LIQUID JET RECORDING APPARATUS

[75] Inventors: Makoto Shibata, Kawasaki; Haruhiko Terai; Hirokazu Komuro, both of Yokohama, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/627,335

[22] Filed: Apr. 4, 1996

Related U.S. Application Data

[63] Continuation of application No. 07/961,338, Oct. 15, 1992, abandoned.

[30] Foreign Application Priority Data

| | | | |
|---|---|---|---|
| Oct. 15, 1991 | [JP] | Japan | 3-266013 |
| Oct. 31, 1991 | [JP] | Japan | 3-286271 |
| Jun. 8, 1992 | [JP] | Japan | 4-147678 |
| Oct. 15, 1992 | [JP] | Japan | 4-277356 |

[51] Int. Cl.[7] .......... C23C 16/511

[52] U.S. Cl. .......... 427/571; 427/574; 427/579; 347/61; 347/62

[58] Field of Search .......... 427/571, 574, 427/579; 347/61, 62

[56] References Cited

U.S. PATENT DOCUMENTS

| | | | |
|---|---|---|---|
| 4,313,124 | 1/1982 | Hara . | |
| 4,345,262 | 8/1982 | Shirato et al. . | |
| 4,459,600 | 7/1984 | Sato et al. . | |
| 4,463,359 | 7/1984 | Ayata et al. . | |
| 4,558,333 | 12/1985 | Sugitani et al. . | |
| 4,567,493 | 1/1986 | Ikeda et al. . | |
| 4,720,716 | 1/1988 | Ikeda et al. . | |
| 4,723,129 | 2/1988 | Endo et al. . | |
| 4,725,859 | 2/1988 | Shibata et al. . | |
| 4,740,796 | 4/1988 | Endo et al. . | |
| 4,768,038 | 8/1988 | Shibata | 346/76 PH |
| 4,873,622 | 10/1989 | Komuro et al. | 346/140 R |
| 4,936,952 | 6/1990 | Komuro . | |
| 4,965,594 | 10/1990 | Komuro | 346/140 R |
| 5,062,937 | 11/1991 | Komuro . | |
| 5,124,014 | 6/1992 | Foo et al. | 204/192.32 |
| 5,140,345 | 8/1992 | Komuro . | |

FOREIGN PATENT DOCUMENTS

| | | |
|---|---|---|
| 0289139 | 11/1988 | European Pat. Off. . |
| 0424905 | 5/1991 | European Pat. Off. . |
| 54-056847 | 5/1979 | Japan . |
| 59-123670 | 7/1984 | Japan . |
| 59-138461 | 8/1984 | Japan . |
| 60-071260 | 4/1985 | Japan . |
| 3024268 | 2/1991 | Japan . |
| 2212974 | 8/1989 | United Kingdom . |

OTHER PUBLICATIONS

IBM Technical Disclosure Bulletin, "Thermal Ink Jet Heater Devices Incorporating Diamond–Like Carbon Films as Protective Overcoats" vol. 34, No. 2, pp. 19–20, Jul. 1991.

*Primary Examiner*—Timothy Meeks
*Attorney, Agent, or Firm*—Fitzpatrick, Cella, Harper & Scinto

[57] ABSTRACT

A substrate for a liquid jet recording head is provided at least with a supporting member, an exothermic resistive element arranged on the supporting member for generating thermal energy to be utilized for discharging recording liquid, and pairs of wiring electrodes connected to the exothermic resistive element at given intervals. Such a substrate comprises a layer formed with a film produced by the application of a bias ECR plasma CVD method. With the layer thus formed, a desirable configuration of the wiring stepping portions as well as a desirable film quality can be obtained so as to make the surface of the substrate smooth thereby to implement a liquid jet recording head having an excellent durability at a low manufacturing cost when such a substrate is used for the fabrication of the liquid jet recording head.

8 Claims, 7 Drawing Sheets

METHODS FOR MANUFACTURING A SUBSTRATE FOR A LIQUID JET RECORDING HEAD, LIQUID JET RECORDING HEAD, AND LIQUID JET RECORDING APPARATUS

This application is a continuation of application Ser. No. 07/961,338 tiled Oct. 15, 1993 now abandoned.

BACKGROUND OF THE INVENTION

1. Field of the Invention

The present invention relates to a substrate for a liquid jet recording head for performing recording with the recording liquid ejected from the discharging ports thereof by the utilization of thermal energy, a manufacturing method therefor, and a liquid jet recording head and a liquid recording apparatus using such a substrate. More particularly, the invention relates to a substrate for a liquid jet recording head with a supporting member and each layer which have been improved, a manufacturing method therefor, a liquid jet recording head, and a liquid jet recording apparatus.

2. Related Background Art

The liquid jet recording method, wherein recordings are performed by utilizing thermal energy to cause ink or other liquid droplets to be ejected and to fly onto a recording medium (paper in most cases), is a recording method of a non-impact type. Therefore, it has the advantages among others that there is less noise in operating it, direct recordings are possible on an ordinary sheet, and color image recordings are also possible with ease by the use of multiple color ink. Furthermore, the recording apparatus can be built with a simple structure to make it easier to fabricate a highly precise multi-nozzles. There is thus an advantage that with this type of recording apparatus, it is possible to obtain with ease recordings with a high resolution at high speeds. The liquid jet recording apparatus has, therefore, come rapidly into wide use recent years.

FIG. 9A is a perspective and broken view showing the principal part of a liquid jet recording head used for this liquid jet recording method. FIG. 9B is a vertically sectional view showing the principal part of this liquid jet recording head on a plane parallel to its liquid passage. As shown in FIGS. 9A and 9B, this liquid jet recording head is generally structured with a number of fine discharging ports 7 for ejecting ink or other liquid for recording; passages 6 provided respectively for each of the discharging ports 7 and conductively connected with each of the discharging ports 7; a liquid chamber 10 provided commonly for each of the liquid passages 6 to supply the recording liquid for the respective passages 6; a liquid supply inlet 9 arranged on the ceiling portion of the liquid chamber 10 for supplying liquid to the liquid chamber 10; and a substrate 8 for the liquid jet recording head having exothermic resistive elements 2*a* for each of the liquid passages 6 for giving thermal energy to recording liquid. The liquid passages 6, the discharging ports 7, the liquid supply inlet 9, and the liquid chamber 10 are integrally formed with the ceiling plate 5.

As shown in FIG. 9B, the substrate 8 for the liquid jet recording head is of such a structure that on its supporting member 1 an exothermic resistive layer 2 made of a material having a volume resistivity of a certain amplitude and then, on the exothermic resistive layer 2, an electrode layer 3 made of a material having a desirable electric conductivity is laminated. The electrode layer 3 has the same configuration as the exothermic resistive layer 2, but it has a partial cut-off portion where the exothermic resistive layer 2 is exposed. This portion becomes an exothermic resistive element 2*a,* that is, the portion where heat is generated. The electrode layer 3 becomes two electrodes 3*a* and 3*b* with the exothermic resistive element 2*a* therebetween, and a voltage is applied across these electrodes 3*a* and 3*b* to enable an electric current to flow in the exothermic resistive element 2*a* to generate heat. The exothermic resistive element 2*a* is formed on the substrate 8 for the liquid jet recording head to be positioned at the bottom of each of the liquid passages 6 corresponding to the ceiling plate 5. Further, on the substrate 8 for the liquid jet recording head, a protective layer 4 is provided for covering the electrodes 3*a* and 3*b,* and the exothermic resistive elements 2*a.* This protective layer 4 is provided for the purpose to protect the exothermic resistive elements 2*a* and electrodes 3*a* and 3*b* from the electrolytic corrosion and electrical insulation breakage due to its contact with recording liquid or the permeation of the recording liquid. It is a general practice that the protective layer 4 is formed using $SiO_2$. Further, on the protective layer 4, an anti-cavitation layer (not shown) is provided. As a formation method for the protective layer 4, various vacuum film formation methods, such as plasma CVD, sputtering, or bias sputtering, are employed.

As the supporting member 1 for the substrate 8 for the liquid jet recording head, while it is possible to use a plate made of silicon, glass, ceramic, or the like, the silicon plate is most often used for the reasons given below.

When a glass plate is used for the supporting member 1 to produce a liquid jet recording head, heat tends to be accumulated in the supporting member 1 if the driving frequency of the exothermic resistive element 2*a* is increased because glass is inferior in heat conductivity. As a result, the recording liquid in the liquid jet recording head is unintentionally heated to develop bubbles, often leading to the undesirable ejection of the recording liquid and other defectives.

On the other hand, when ceramic is used for the supporting member 1, alumina is mainly employed because alumina can be produced in a comparatively large size and has a heat conductivity better than glass. Nevertheless, in a case of ceramic, it is a general practice that the powdered material is baked to produce the supporting member 1, which often results in pin holes or small projections of several $\mu$m to several ten $\mu$m or other surface defectives. Due to such surface defectives, short and open circuits of the wirings and other troubles may take place to cause the reduction of the yield. Also, the surface roughness is usually $R_a$ (average roughness along the center line)=approximately 0.15 $\mu$m. There are thus many cases where it is difficult to obtain the surface roughness best suited for the film formation of the exothermic resistive layer 2 and others with a desirable durability. For example, if alumina is used for the production of the liquid jet recording head, there occur the peeling of the exothermic resistive layer 2 from the substrate 8 for the liquid jet recording head, and others; hence shortening the life of the durability of the recording head.

In this respect, there is a method to improve the contacting capability of the exothermic resistive layer 2 by smoothing the roughness of the surface of the supporting member 1 with a polish machining given thereto. However, since the hardness of alumina is high, there is automatically a limit for the adjustment of the surface roughness for the purpose. To counteract this, it may be conceivable that a glazed layer (a welded glass layer) is provided for the surface of an alumina supported member to produce a glazed alumina supporting member; thus solving the problem of the surface defectives and surface roughness attributable to the pin holes or small projections with the provision of the grazed layer. There is still a problem that the glazed layer cannot be made thinner than 40 to 50 μm in view of its manufacturing method. As a result, heat tends to be accumulated as in the case of using glass.

In contrast to the use of the glass or ceramic for the supporting member 1, there is an advantage in using silicon for the supporting member 1 that the problems mentioned above will not be encountered. Particularly, if a polycrystalline silicon substrate is used for the supporting member 1, there is no need for any process to pickup crystals as in a case of the application of a mono crystal silicon for use. Therefore, its manufacturable size is not confined. Here, the inventor hereof et al. find that not only there is an advantage in its manufacturing cost, but also it is possible to obtain a square column ingot if the polycrystalline silicon substrate is produced by the application of a casting method. It is thus regarded as advantageously applicable from the viewpoint of the material yield when square supporting members 1 are cut for the intended use.

When silicon is used for the supporting member 1, it is a general practice that for the purpose to obtain better characteristics as the substrate 8 for the liquid jet recording head, a lower layer made of $SiO_2$ serving as a heat storage layer is provided for the entire surface or a part of the surface of the supporting member so as to balance the heat radiating and accumulating capabilities of the supporting member 1.

Also, if the supporting member is an electric conductor, the above-mentioned lower layer should be arranged to serve dually as an insulator in order to avoid any short circuit electrically. This is convenient from the viewpoint of both design and cost. Then, as the method to form this lower layer (hereinafter referred to as heat storage layer), there are those to form it by means of thermal oxidation given to the surface of the supporting member 1 made of silicon and to deposit $SiO_2$ on the supporting member 1 by various vacuum film formation methods (sputtering, bias sputtering, thermal CVD, plasma CVD, and ion beam, for example).

Also, depending on the structures of the substrate for the liquid jet recording head, two layers of wirings are provided in matrix on the supporting member. In this case, the wirings connected directly to this exothermic resistive layer will be provided on a wiring layer which is positioned farther away from the supporting member due to its positional relationship with the liquid passages. Consequently, the wiring layer which is closer to the supporting layer is in a mode that such a layer is buried in the heat storage layer. FIG. 12 is a schematic cross section representing the structure of the substrate for the liquid jet recording head.

For the substrate for the liquid jet recording head shown in FIG. 12, a heat storage layer 402 is formed separately for a first heat storage layer 402*a* and a second heat storage layer 402*b*. On the silicon supporting member 401, the first heat storage layer 402*a* made of $SiO_2$ is provided. On the first heat storage layer 402*a*, a lower wiring 403 serving as a first layer for the wiring layer is formed. This first heat storage layer 402*a* can be formed by the thermal oxidation given to the silicon supporting member 401. The lower wiring 403 is generally made of aluminum, and is provided for driving the exothermic portions in matrix, for example. On the other hand, the second heat storage layer 402*b* is formed on the upper face of the first heat storage layer 402*a* with the lower wiring 403 thus formed so that this layer covers the lower wiring 403. The second heat storage layer 402*b* is formed with $SiO_2$. Further, on the second heat storage layer 402*b*, an exothermic resistive layer 404, an electrode layer 405 which serves as a second layer for the wiring layer, a protective layer 406 made of $SiO_2$, and an anti-cavitation layer 407 are provided in the same manner as the substrate for the liquid jet recording head shown in FIG. 9. The second heat storage layer 402 cannot be formed by means of the thermal oxidation due to the presence of the lower wiring 403. Therefore, it is formed by the application of the plasma CVD, sputtering, bias sputtering, or the like as in the case of the protective layer 406.

As described above, the silicon dioxide layer represented by the $SiO_2$ layer is used for the heat storage layer and protective layer in fabricating the substrate for the liquid jet recording head. These layers are classified into (1) the layer which can be formed by means of the thermal oxidation given to the supporting member made of silicon (the heat storage layer in FIG. 9 and the first heat storage layer 402*a* in FIG. 12) and (2) the layer which cannot be formed by means of the thermal oxidation (the protective layer 4 in FIG. 9, the second heat storage layer 402*b* and the protective layer 406 in FIG. 12, or in such a case where the supporting member is made of metal or the like) or the layer which is formed with a nitride film or films other than the dioxide film. Here, according to this classification, the problems existing in forming these layers will be discussed.

(1) The layer which can be formed by means of the thermal oxidation:

For the layers formable by means of the thermal oxidation, it is desirable to conduct their formation by the thermal oxidation in view of cost and the film quality of the layer obtainable. In other words, when the layer is formed by means of those conventional vacuum film formation methods, the film thickness tends to be uneven and the film formation speed is slow as described later. Also, dust particles are easily generated at the time of film formation. The dust particles mixedly contained in the film result in the granular defectives of several μm diameter. Thus, there is a possibility that this will cause breakage due to cavitation. Further, there is a problem that electric current leaks from these granular defectives to cause the electric short circuit. It may also be possible to use a spin-on-glass method or a dip-pull method to form the layer made of $SiO_2$ on the surface of the supporting member without the application of the thermal oxidation process. However, the film quality obtainable by the application of any one of these methods is not desirable, and in order to secure a desirable film quality, it becomes necessary to conduct a heat treatment at high temperature or impure particles tend to be mixed in the film. In addition, there is a problem that in some cases, the $SiO_2$ layer of approximately 3 μm film thickness, which is required for the heat storage layer, cannot be formed.

Now, the description will be made of the characteristics of the $SiO_2$ layer formed by means of the thermal oxidation hereunder.

The silicon substrate (supporting member) which is an object to be formed here by the thermal oxidation is a polycrystalline silicon supporting member as described above. In this respect, it has been found by the inventor hereof et al that when an $SiO_2$ layer is formed by means of the thermal oxidation given to the surface of the polycrystalline silicon supporting member, there occurs a difference in level of approximately less than several hundred nm on the surface of the $SiO_2$ layer due to the difference in the thermal oxidation velocities attributable to the different crystalline orientations. If such a difference in level occurs on the surface, possible damages are concentrated on that staged portion whether due to thermal shock given by heating and cooling or to the cavitation generated at the time of ejecting liquid for recording. Therefore, if the exothermic resistive elements should be formed where such a difference in level exists, there would be encountered a problem that its reliability is significantly reduced. More specifically, when the ejection of the liquid is repeated for recording, the cavitation will be concentrated on the difference in level on the surface. Thus, a problem arises that a breakage may take place earlier. In order to avoid such a problem as this, it is conceivable that the thermally oxidized surface is flattened by a polish machining. However, with an ordinary machining technique, it is impracticable to flatten a layer of less than several μm thick. It is also conceivable that an extremely thick thermal oxidation layer is formed and is removed by a polish machining for the purpose. With its cost in view, this is quite disadvantageous.

(2) The layer which cannot be formed by means of the thermal oxidation:

When formation is impossible by the application of the thermal oxidation, the $SiO_2$ layer will be formed inevitably by the application of the plasma CVD, sputtering, bias sputtering, or other vacuum film formation methods. In this case, the $SiO_2$ layer is formed on-the wiring layer, exothermic resistive layer, and polycrystalline silicon thermal oxidation layer. This layer must be formed desirably even at a place where the difference in level exists. Also, there are some cases where a wiring layer and exothermic resistive layer are to be formed on this layer of $SiO_2$ thus formed, it is desirable to flatten the upper surface of this layer even in the portion where the difference in level takes place. Hereunder, the description will be made of the problems existing in forming the $SiO_2$ layer by the application of the plasma CVD, sputtering, and bias sputtering, respectively.

In the plasma CVD, the configuration of the film becomes acutely steep configuration of the wirings where difference in level takes place; thus making the film quality degraded in such portion thereof. There is also a problem that minute irregularities are created on the surface of the film to be formed. At first, the description will be made of the acutely steep configuration in the portion where difference in level exists.

FIG. 13A is a cross-sectional view showing the composition of the difference in level taking place in the $SiO_2$ film 410 formed by a plasma CVD on an aluminum wiring 409. When the difference in level is composed in applying the plasma CVD, the cut created by the difference in level becomes deep as the portion which is indicated by an arrow A in FIG. 13A. Therefore, as shown in FIG. 13B, if a thin film 411 is formed by deposition, sputtering, or other method on the $SiO_2$ film 410, the expansion of the film over the portion A is not good enough; thus making it thinner in that portion than the film over the flat portion. Thus, when wiring and others are formed there, the current density becomes greater to cause heat generation or wire breakage. Also, when a patterning is conducted for the wirings to be formed on the $SiO_2$ film 410, resist is not desirably removed by the application of the ordinary photolithography technique in the portion where the difference in level occurs, and there tends to occur short circuits between the wirings. FIG. 13C is a view showing the portion represented in FIG. 13B, which is observed in the direction indicated by an arrow C in FIG. 13A. It shows the state where a film 411 (the slashed portion in FIG. 13C), an aluminum wiring, for example, on the $SiO_2$ film 410, is extended along the differences in level. This problem arises more easily for a film between layers, that is, an $SiO_2$ layer which is placed between a plurality of wiring layers.

When the $SiO_2$ film is formed by the application of the plasma CVD, the film quality in the portion where the difference in level takes place becomes more degraded as shown at B in FIG. 13A. If the $SiO_2$ film thus formed is etched with a hydrofluoric acid etching solution, the film at B is etched instantaneously because its minuteness is low whereas the film on the flat portion is being etched at a velocity two to four times that of the $SiO_2$ film formation by the thermal oxidation. In such a portion of the film as having a low minuteness, cracks tend to occur due to the thermal stress created by the repeated heating and cooling of the heaters (exothermic portions). Therefore, when the film is used as a protective layer, its function will easily be lost. Also, for the patterning of a film which must be laminated on the $SiO_2$ film, that is, the $HfB_2$ film to be used for the exothermic resistive layer and the Ta film to be used for the anti-cavitation layer, for example, it becomes impossible to use any hydrofluoric acid etching solution.

Now, the description will be made of the minute irregularities on the surface of the $SiO_2$ film which is formed by the application of the plasma CVD.

In general, there tend to occur minute irregularities on the surface of the film produced by the plasma CVD even if it is formed on a flat substrate. These irregularities on the $SiO_2$ film will also remain on the anti-cavitation layer which is directly in contact with ink. Therefore, when the ink bubbling takes place on the heater surface, the initiation points of bubbling (bubbling nuclei) are scattered on the heater surface. Thus, the film boiling phenomenon can hardly be reproduced with stability and there is a possibility that this instability will produce adverse effects on the ejection performance.

In the sputtering method, the configuration of a film is acutely steep in the wiring portion where the difference in level takes place. The film quality of the film thus formed is not desirable. Also, there is a problem that the so-called particles are great. The fact that the configuration of the film is acutely steep in the portion where the difference in level occurs is the same as in the case of the application of the plasma CVD. Therefore, the description thereof will be omitted. Here, the film quality will be described at first.

When the $SiO_2$ film is formed by means of an ordinary sputtering method (that is, a method to sputter an $SiO_2$ target with Ar gas), it is impossible to form any minute film unless the substrate temperature is raised to approximately 300° C. However, if the temperature is raised to approximately 300° C., great hillocks are developed in the aluminum layer to be used for wirings. Particularly, when a hillock is developed at the edge portion of the aluminum wiring 409 as shown in FIG. 14, the substantial difference in the film thickness of the $SiO_2$ film 410 formed thereon becomes great; hence degrading the covering capability as a film. In other words, cracks tend to occur at the stepping portion, and if ink is in contact with the electrodes from such cracked portions, electrolytic corrosion will ensue, also, the film quality in the portion where the difference in level occurs cannot be improved even if the substrate temperature is raised to 300° C. There will be encountered the same problem as in the case of the film formed by the application of the plasma CVD.

As a method to form a film at low temperatures without degrading the film quality, it is possible to conduct sputtering an $SiO_2$ target in an atmosphere of Ar and $H_2$. However, it is still impossible to improve the film quality in the portion where the difference in level takes place. Also, the film configuration in such portion is the same as at B in FIG. 13A. The same problem as in the case of the film formation by the application of the plasma CVD is encountered. Moreover, if an $H_2$ gas is added, the film formation velocity is lowered (conceivably, the more $H_2$ is added, the lower becomes the velocity); thus reducing the processing capability.

Also, in the film formation chamber of a sputtering apparatus, a target, shield plate, shutter plate, and others are arranged to make its structure more complicated than the reaction chamber of a plasma CVD apparatus. Then, when an $SiO_2$ and other insulation films are formed, spark discharge is generated due to charge up or the like. Thus, a problem is encountered here that the scattered materials due to the spark discharge and the deposited dust particles which cannot be removed by maintenance (cleaning) in the complicated film formation chamber fall down as particles onto the substrate and are accumulated thereon. In other words, if these dust particles are contained in the film, granular defectives of several $\mu$m will ensue, and if the exothermic resistive elements are formed on the portions having such defectives, there is a possibility that the cavitation breakage occurs at the time of ejection. If the substrate is electrically conductive, electric current will leak from such granular defective portions to cause electric short circuit. Because of this, it becomes difficult to enhance the reliability and durability of a recording head to be manufactured.

The bias sputtering method is a method to flatten the configuration at the position where the difference in level takes place by applying a high frequency power also to the substrate side to utilize the sputtering effects produced by its self bias. Therefore, unlike the sputtering or the plasma CVD, there is no problem as far as the insufficient flattening of the stepping portion is concerned. FIG. 15 is a schematic view showing the composition of the stepping portion (the portion where the difference in level exists) when the $SiO_2$ layer 410 is formed on an aluminum wiring 409 by the application of a bias sputtering method. From FIG. 15, it is clear that compared to the plasma CVD or the like, the stepping portion has been flattened. Nevertheless, as is the case of the ordinary sputtering method, particles are easily generated. Also, there is a problem that the film formation velocity is low. Here, the film formation velocity in the bias sputtering method will be discussed.

In the bias sputtering method, etching is conducted simultaneously while a high frequency bias is given to the substrate side. As a result, compared to the ordinary sputtering, the film formation velocity of the bias sputtering is reduced by an amount equivalent to the etching thus conducted. In order to make the film quality at the stepping portion and coverage desirable, there is a need for the addition of etching for more than 10% of the film formation velocity. Accordingly, compared to the ordinary sputtering, the film formation velocity is lowered more than 10%. Hence, the productivity is reduced that much. In this respect, if the bias is applied too much, the substantial film formation velocity is further lowered. Also a problem may arise that the stepping portion cannot be covered. Therefore, it is desirable to define the etching velocity to be 5% to 50% of the film formation velocity without any bias being applied.

Furthermore, both in the sputtering and bias sputtering methods, if the high frequency power applied to the cathode (target) is increased too great, the target is cracked or abnormal discharge is generated. With the technique currently available, therefore, it is considered that the film formation velocity is limited to 200 nm/min. From this point of view, these are regarded as methods having a low productivity.

As described above, when the heat storage layer protective layer, or insulation film between the wirings are formed for the substrate for the liquid jet recording head, there are many aspects which must be improved with respect to the film quality and the surface smoothness or the film formation velocity among others.

SUMMARY OF THE INVENTION

The present invention is designed with view to solving the above-mentioned problems and to making the required improvements. It is the principle object of the invention to provide a substrate for a liquid jet recording head having the heat storage layer (lower layer), protective layer, and insulation film between the wirings (insulation film between layers) with desirable characteristics and excellent durability, a manufacturing method therefor, a liquid jet recording head and a liquid jet recording apparatus.

In order to achieve the above-mentioned object, there is mainly provided a substrate for the liquid jet recording head which comprises:

a supporting member;

exothermic resistive elements arranged on this supporting member for generating thermal energy to be utilized for ejecting liquid;

a pair of wiring electrodes connected to the foregoing exothermic resistive elements with given intervals; and layers structured with films formed by a bias ECR plasma CVD method, or a manufacturing method for such a substrate for the liquid jet recording head, or a liquid jet recording head having the foregoing substrate, or a liquid jet recording apparatus with the foregoing recording head being mounted therein.

DETAILED DESCRIPTION OF THE PREFERRED EMBODIMENTS

Figure 1A:
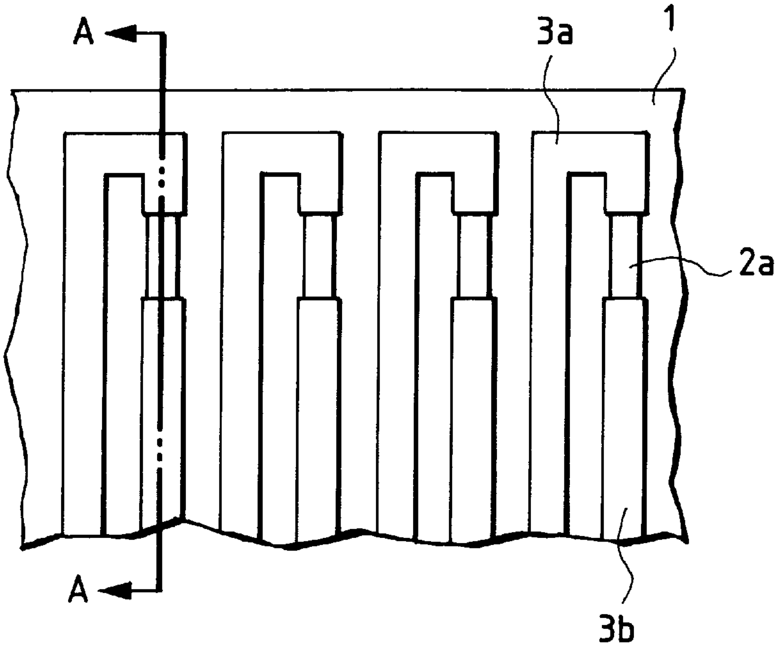
FIGS. 1A and 1B are, respectively, a plan view and a cross-sectional view taken along line A—A of FIG. 1A and showing a substrate.

At first, the description will be made of a formation method for a lower layer serving as a heat storage layer.

In the present invention, the formation of a lower layer is a difficult aspect whereas it is necessary to provide a lower layer of several Ξm thick in order to implement the reduction of the energy required for bubbling while securing the heat releasing capability of the substrate.

When the lower layer is formed on a polycrystalline silicon supporting member, an alumina supporting member without any grazed layer, ceramic supporting member such as aluminum nitride, silicon nitride, and silicon oxide, or a metallic supporting member such as aluminum, stainless steel, copper, covar, and the like, among others, the $SiO_2$ film formation is performed by a bias ECR plasma CVD film formation method instead of the formation of an $SiO_2$ film by the application of a conventional vacuum film formation method (sputtering, bias sputtering, plasma CVD, or the like).

Also, when a film other than the $SiO_2$ film is provided as a lower layer, the film formation will be performed by the bias ECR plasma CVD method.

Now, the ECR plasma CVD method will be described at first. In contrast to an ordinary plasma CVD method wherein plasma is generated with a high frequency field of 13.56 MHz, the ECR plasma CVD method uses an electronic cyclotron resonance (ECR) to generate a high-density, high-activation plasma in a plasma generation chamber under a high vacuum, and this plasma is transferred to a film formation chamber to perform a film formation as required. Compared to the conventional plasma CVD, this method has an advantage among others that it is possible to make the film formation velocity fast with less damages to semiconductor elements. The bias ECR plasma CVD method is such that a high frequency power is applied to a substrate placed in a film formation chamber as in an ECR plasma CVD and then the ion shock effect is enhanced in the same manner as a bias sputtering method to allow a deposition and etching to be advanced simultaneously.

The bias ECR plasma CVD method is advantageous in that not only the film velocity is high and the stepping portion can be flattened, but also particles are less as compared with the sputtering or bias sputtering method. In other words, when an $SiO_2$ film is formed by the application of the bias ECR plasma CVD film formation method, there is only $O_2$ gas or $O_2$+Ar existing in the plasma generation chamber, and if only the interior of the film formation chamber is clean, particles can rarely be created because the formation of the $SiO_2$ results from the reaction between the $O_2$ gas and $SiH_4$ gas. Also, as the film formation is repeated, the film formation chamber becomes stained due to adhesive particles, while it is difficult to clean the sputtering chamber used for the conventional plasma CVD and bias sputtering method because there are the target, target shield, and others in its interior. Whereas it is extremely difficult to clean the chamber completely according to the conventional method, it is easy for the bias ECR plasma CVD method to perform its cleaning because the film formation chamber used for the bias ECR plasma CVD is structured so simply as to have only a substrate holder in it and also with the existing orientation of the film formation, the adhesive particles are caused to concentrate in the vicinity of the substrate holder. Furthermore, it is possible to induce $CF_4$, $C_2F_6$, or other gas in place of the $O_2$ gas to give etching to the film adhering to the interior of the film formation chamber. With this easier way of cleaning, this method is excellent in reducing the particles which will create the problem related to the durability of the liquid jet recording head.

Figure 11:
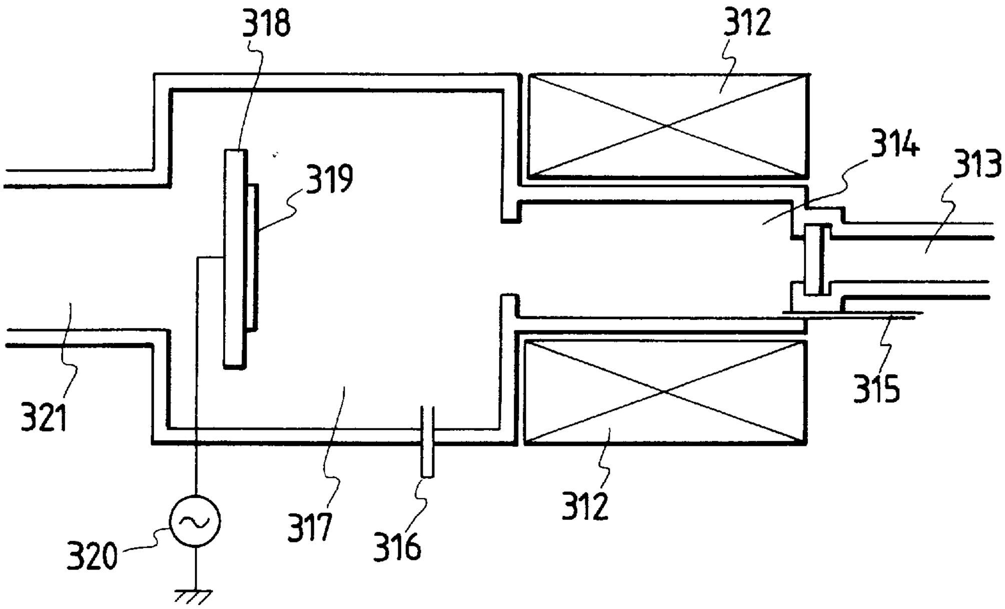
FIG. 11 is a view showing the structure of a bias ECR plasma CVD apparatus.

Now, in conjunction with FIG. 11, the structure of a bias ECR plasma CVD apparatus will be described.

The entire system is arranged to be evacuated to a high vacuum by means of an exhaust pump (not shown) connected to an exhaust outlet 321. To a plasma generation chamber 314, microwave of 2.45 GHz is introduced through a microwave guide 413, while $O_2$ gas or a mixed gas of $O_2$ and Ar is introduced through a first gas inlet 315. At this juncture, the magnetic force of a magnet 312 arranged around the outer portion of the plasma generation chamber 314 is adjusted to satisfy the condition of ECR (electronic cyclotron resonance). Then, a high-density, high-activation plasma is generated in the plasma generation chamber 314. This plasmic gas is transferred to a film formation chamber 317. At this juncture, $SiH_4$ gas is introduced from a second gas inlet 316 provided for the film formation chamber 317. Then, an $SiO_2$ film is deposited on a supporting member 319 stacked on a substrate holder 318 arranged in the film chamber 317. At the same time, then, a high frequency is applied to the substrate holder 318 from an RF power source 320 connected to the substrate holder 318 for a simultaneous etching given to the supporting member 319.

Figure 1B:
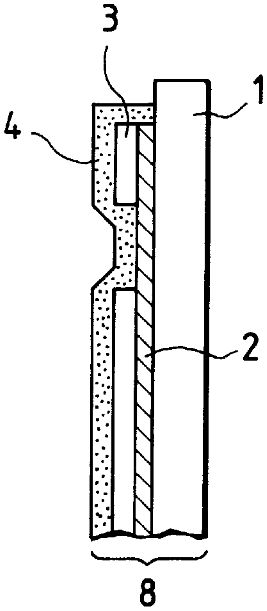
Figure 2:
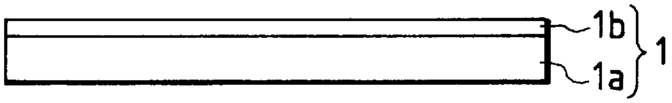
FIG. 2 is a cross-sectional view showing the structure of a supporting member used for the formation of the substrate.

On the $SiO_2$ layer 1*b* of the supporting member 1*a* thus formed for the substrate shown in FIG. 2, an electrode layer 3 and exothermic resistive layer 2 respectively shown in FIGS. 1A and 1B, for example, are patterned in a given configuration to form electrothermal transducers, and further, as required, a protective layer 4 is provided; thus obtaining a substrate 8 for a liquid jet recording head.

In this respect, the configuration of the electrothermal transducers and the structure of the protective layer 4 among others are not limited to those shown in FIGS. 1A and 1B. Subsequently, on the substrate 8 for the liquid jet recording head, liquid passages 6, discharging ports 7 and as required, a liquid chamber 10 are formed as shown in FIGS. 9A and 9B, for example; thus making it possible to form a liquid jet recording head according to the present invention.

Figure 9A:
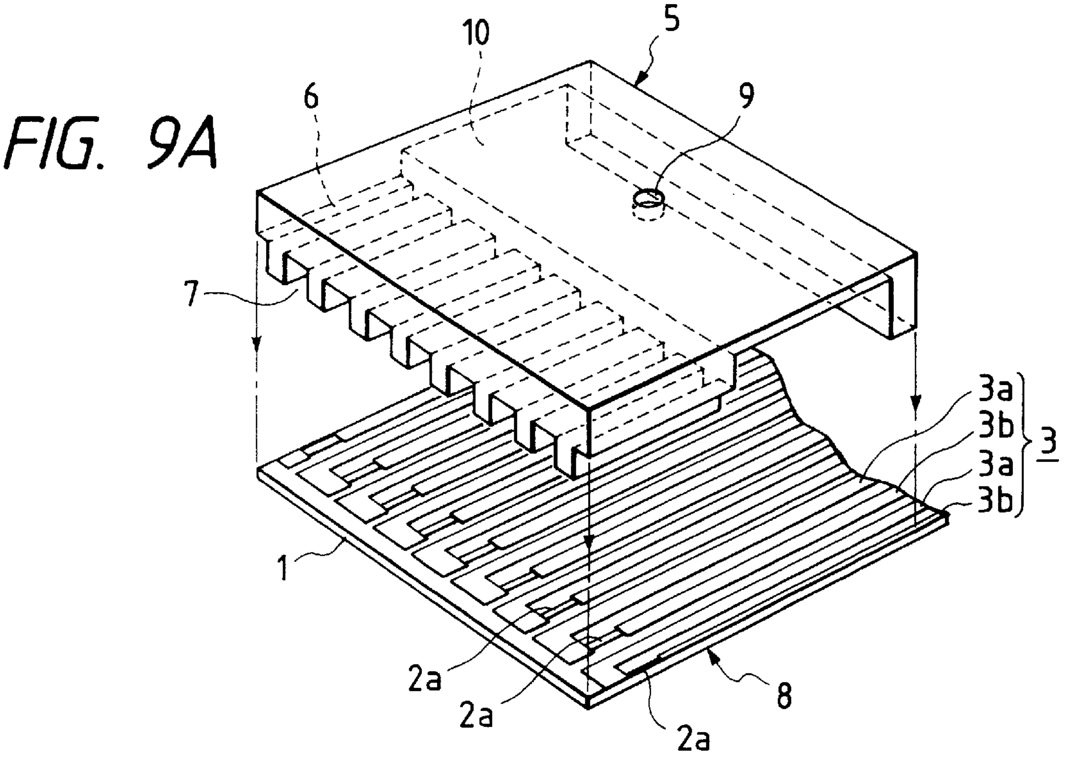
FIG. 9A is a partially cut-off perspective view showing the principal part of the liquid jet recording head.
Figure 9B:
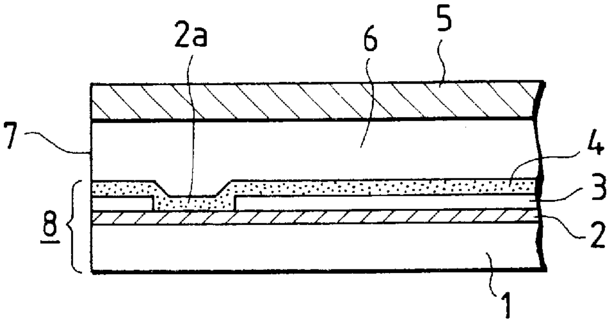
FIG. 9B is a vertically sectional view showing the principal part of the liquid jet recording head on a plane including the liquid passage.

In this respect, the structure of the recording head is not limited to the one shown in FIGS. 9A and 9B, either.

For example, the recording head shown in FIG. 9A is of such a structure that the direction in which liquid is ejected from the discharging ports and the direction in which liquid is supplied to the locations in the liquid passages where the exothermic portions of the thermal energy generating elements are provided are substantially the same. The present invention, however, is not limited to it. For example, it may be possible to apply the present invention to a liquid jet recording head having the foregoing two directions different from each other (substantially vertical, for example).

Now, for the supporting member for a substrate for a liquid jet recording head, aluminum, mono crystal Si, glass, alumina, alumina graze, SiC, AlN, SiN, or others can be used. However, the present invention which employs the bias ECR plasma CVD film formation method is best suited for the polycrystalline Si supporting member.

The polycrystalline Si supporting member has the material properties required for a substrate for a liquid jet recording head, which are identical to those of the mono crystal Si substrate. Besides, it has an excellent cost performance and is easily obtainable in a large area as well. However, when a thermal oxidation is given thereto, the difference in level occurs per crystal grain due to the difference in oxidation velocity per crystal plane. For example, when the thickness of a thermally oxidized layer is 3 μm, the difference in level on its surface will be approximately 1,000 Å. In order to flatten the difference in level, an $SiO_2$ film is formed by the application of the bias ECR plasma CVD film formation method instead of forming a heat storage layer by means of the thermal oxidation. Hence, it becomes possible to solve the problem that the cavitation is concentrated on such portions having difference in level at the time of durable ejection thereby to cause an early breakage.

The fundamental structure of an ink jet recording head according to the present invention can be the same as the structure publicly known. Therefore, it can be fabricated fundamentally without changing the known manufacturing processes. In other words, there can be used $SiO_2$ for the heat storage layer (2 to 2.8 μm); $HfB_2$ and others, for electrothermal transducers (exothermic resistive layer) (0.02 to 0.2 μm); Ti, Al, Cr, and others, for electrodes (0.1 to 0.5 μm); $SiO_2$, SiN, and others, for the upper protective layer (first protective layer) (0.5 to 2 μm); Tat $Ta_2O_5$ and others, for the second protective layer (0.3 to 0.6 μm); and photosensitive polyimide and other, for the third protective layer.

Hereinafter, the description will be made in detail of an example of forming the lower layer which serves as a heat storage layer.

Embodiment 1-1

A stock of aluminum 99.99% mixed with 4% magnesium in terms of weight percentage is rolled and then is cut into a square substrate of 300×150×1.1. Subsequently, with a diamond bite, it is precisely cut to obtain a mirror-finish substrate with the surface roughness of 150 Å maximum.

Then, with the foregoing bias ECR plasma CVD apparatus, an $SiO_2$ film (2.8 μm) is formed. Microwave of 2.45 GHz is introduced from the microwave guide 312 and $SiH_4$ is introduced from the gas inlet 315. Thus, the $SiO_2$ film is deposited on the supporting member 319. At the same time, then, a high frequency is applied to the supporting member holder 318 to perform etching simultaneously. Conditions on film formation

| | |
|---|---|
| $O_2$ gas flow rate: | 120 SCCM |
| $SiH_4$ gas flow rate: | 40 SCCM |
| Microwave power: | 1 kW |

-continued

| | |
|---|---|
| Bias high frequency power: | 1 kW |
| Film formation chamber pressure: | 0.2 Pa |

Then, film thickness of 28,000 A is obtained in 8 minutes.

After the $SiO_2$ film has been formed by the application of the bias ECR plasma CVD, the surface difference is measured by a probe type roughness meter. There is no significant difference recognized from the condition before the film formation because the maximum surface difference created is less than 15 nm.

Here, the above-mentioned condition is one of the specific examples, but, in general, $O_2$—$SiH_4$ is used for a gas seed; its flow ratio ($O_2/SiH_4$) is 2 to 3; the film chamber pressure is 0.2 to 0.3 Pa; the substrate temperature is 150 to 200° C.; the microwave power is 1.0 to 2.5 kW; and the bias high frequency power is approximately 0.5 to 1.0 kW. The film formation velocity is usually 0.2 to 0.4 μm/min.

With a liquid jet recording head fabricated using the aluminum substrate thus manufactured, the effects of the present invention is confirmed by executing a durable ejection test. FIG. 3B is a cross-sectional view schematically showing the state where a heat storage layer is formed by the application of the bias ECR plasma CVD formation method after the substrate has been mirror finished. Thus, the surface difference becomes extremely small according to the present invention.

At first, utilizing the photolithography patterning-technique with the structure shown in FIGS. 1A and 1B, there are formed on an aluminum substrate for fabricating a head, exothermic resistive elements 2 of $HfB_2$ (20 μm×100 μm, film thickness 0.16 μn, and wiring density 16 Pel) and electrodes 3 made of Al (film thickness 0.6 μm and width 20 μm) connected to each exothermic resistive element 2*a*.

Subsequently, the protective layer 4 of $SiO_2$/Ta (film thickness 2 μm·0.5 μm) is formed by means of sputtering method on the upper part of the portion where the electrodes and exothermic resistive elements are formed.

Figure 12:
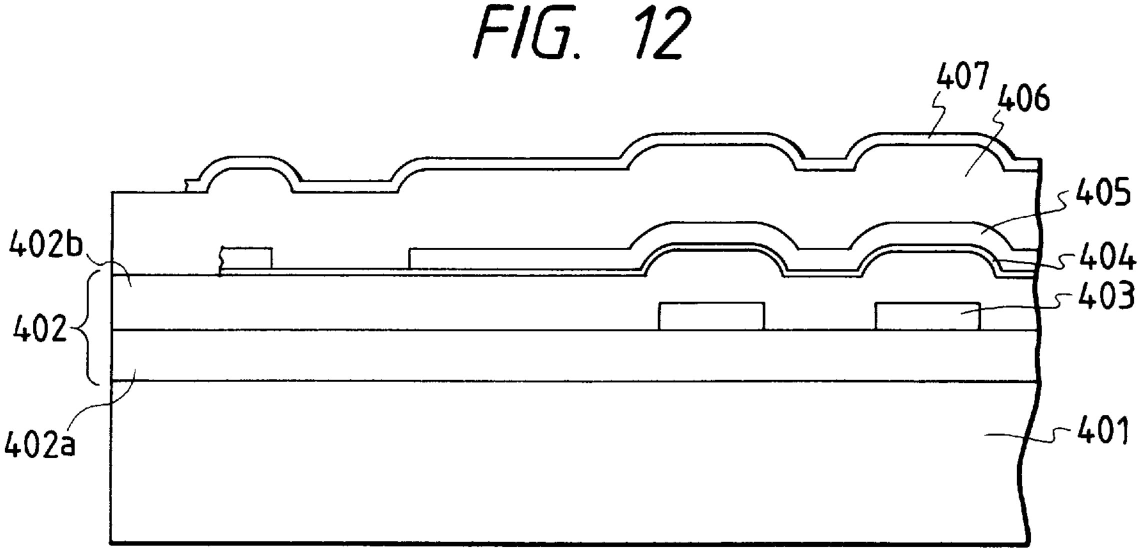
FIG. 12 is a cross-sectional view showing a substrate for a liquid jet recording head including a two-layered wiring layer.
Figure 13A:
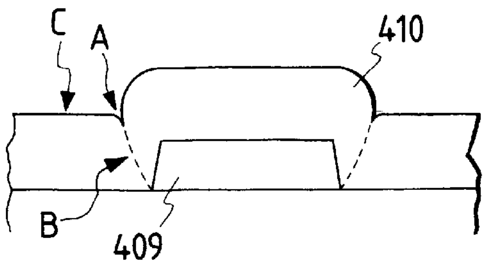
FIGS. 13A, 13B, and 13C are cross-sectional views and a plane view respectively showing the sectional configuration of an $SiO_2$ layer having the difference in level due to an aluminum wiring.
Figure 13B:
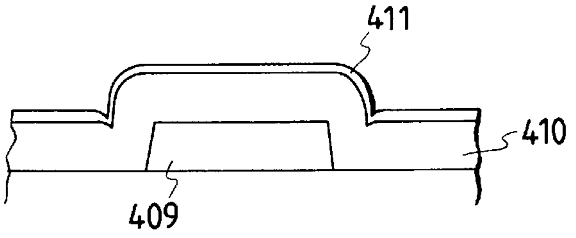
Figure 13C:
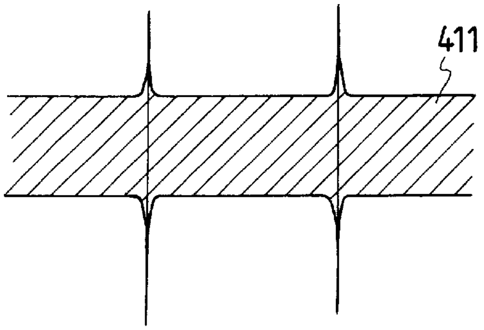
Figure 14:
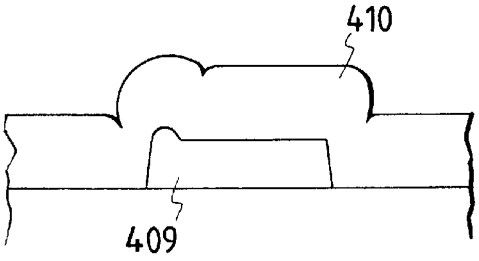
FIG. 14 is a view showing the sectional configuration of an $SiO_2$ layer having the difference in level due to an aluminum wiring.
Figure 15:
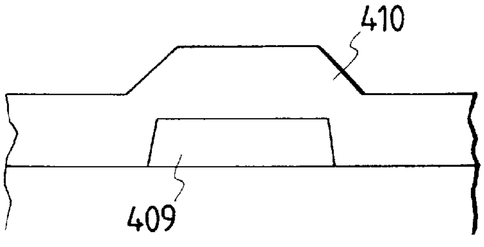
FIG. 15 is a view showing the sectional configuration of an $SiO_2$ layer having the difference in level due to an aluminum wiring.

Then, as shown in FIGS. 9A and 9B, the liquid passages 6, a liquid chamber (not shown), and others are formed with dry films. Thus, at last, the plane Y—Y (FIG. 8) where the discharging port surface is formed is cut to obtain a liquid jet recording head the structure of which is shown in FIG. 12.

Now, printing signals of 1.1 Vth and pulse width 10 μs are applied to each of the exothermic resistive elements to cause liquid to be ejected from each of the discharging ports. The cycle numbers of the electric signals are measured until a wiring of the exothermic resistive element is broken; thus making the evaluation of its durability. The durability test is executed for a head having 256 exothermic resistive elements per head, and the test is suspended the moment any one of the wirings of the exothermic resistive elements is broken.

The results thus obtained are as shown in Table 1.

TABLE 1

| | Discharge durability test | | | | |
|---|---|---|---|---|---|
| | Up to each driving pulse number | | | | |
| Heat storage layer formation | More than 1 $\mu$m particle number | Time required for heat storage layer formation | Head remaining ratio 1 × $10^7$ | 1 × $10^8$ | 3 × $10^8$ |
| Conventional example 1 $SiO_2$ bias sputtering (One-time film formation | 5 pieces/$cm^2$ | 180 min | Discharge durability disabled due to short circuit on substrate | | |
| Conventional example 2 $SiO_2$ bias sputtering (Two-time film formation) | 5 pieces/$cm^2$ | 220 min | 80% | 50% | 20% |
| Present invention Bias ECR plasma CVD | 0.5 pieces/$cm^2$ | 8 min | 100% | 100% | 100% |

Whereas the liquid jet recording head which is fabricated by the conventional technique using an aluminum substrate with a heat storage layer having many numbers of particles contained has resulted in a short circuit of the substrate or in an earlier cavitation breakage attributable to the particle defectives in the exothermic resistive elements, the liquid jet recording head which is fabricated by the method according to the present invention using an aluminum substrate having less particles contained has not caused any cavitation breakage at all. Also, the time required for the heat storage layer formation is significantly reduced from several hours to several minutes.

With the results mentioned above, it has been confirmed that if a head is fabricated with a substrate having the heat storage layer formed with the $SiO_2$ film which is produced by the application of the bias ECR plasma CVD film formation method subsequent to the aluminum substrate having been mirror finished, there is no problem in the heat durability test (discharge durability test), and that the processing time is significantly shortened.

Embodiment 1-2

A polycrystalline Si ingot is produced by means of a casting method (in which molten Si is poured into a mold and is solidified). The granular diameter of crystals is approximately 4 mm on the average.

Then, a square substrate is cut off from the ingot. Lap and polish machining is performed to obtain a mirror finished substrate of 300’150×1.1 with the surface roughness of 150 Å maximum.

Then, with the foregoing bias ECR plasma CVD apparatus, an $SiO_2$ film is formed. Microwave of 2.45 GHz is introduced from the microwave guide 313 and $SiH_4$ is introduced from the gas inlet 316. Thus, the $SiO_2$ film is deposited on the supporting member 318. At the same time, then, a high frequency is applied to the supporting member holder 318 to perform etching simultaneously.

Conditions on film formation

| | |
|---|---|
| $O_2$ gas flow rate: | 120 SCCM |
| $SiH_4$ gas flow rate: | 40 SCCM |
| Microwave power: | 1 kW |
| Bias high frequency power: | 1 kW |
| Film formation chamber pressure: | 0.2 Pa |

Then, film thickness of 28,000 Å is obtained in 8 minutes.

After the $SiO_2$ film has been formed by the application of the bias ECR plasma CVD, the surface difference is measured by a probe type roughness meter. There is no significant difference recognized from the condition before the film formation because the maximum surface difference created is less than 150 Å.

Figure 3A:
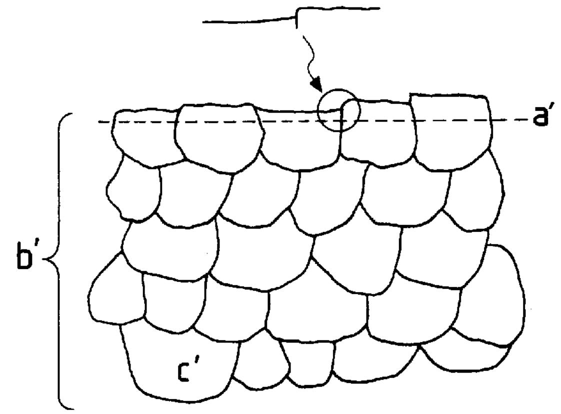
FIG. 3A is a cross-sectional view schematically showing a polycrystalline Si substrate thermally oxidized by an ordinary method.
Figure 3B:
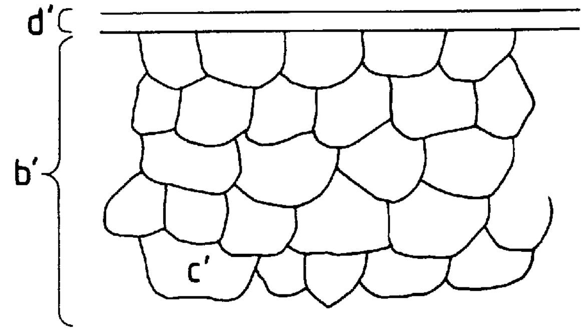
FIG. 3B is a cross-sectional view schematically showing a polycrystalline Si substrate for which a heat storage layer is formed by the application of a bias ECR plasma CVD film formation method subsequent to a mirror finish having been given to the substrate.

FIG. 3A is a cross-sectional view schematically showing a polycrystalline Si substrate when it is thermally oxidized by an ordinary method, while FIG. 3B is a cross-sectional view schematically showing a polycrystalline Si substrate with the heat storage layer is formed thereon by the application of the bias ECR plasma CVD film formation method after it has been mirror finished. In this respect, a reference mark a' designates the surface of the supporting member before the thermal oxidation is given; b', the polycrystalline Si supporting member; c', crystal grains; and d', the lower layer formed by the bias ECR plasma CVD film formation method, respectively, in FIGS. 3A and 3B.

Then, a liquid jet recording head is fabricated using the polycrystalline Si substrate thus manufactured, and the effects of the present invention is confirmed by executing the discharge durability test.

At first, utilizing the photolithography patterning technique with the structure shown in FIGS. 1A and 1B, there are formed on a polycrystalline Si substrate for fabricating a head, exothermic resistive elements 2 of $HfB_2$ (20 $\mu$m×100 $\mu$m, film thickness 0.16 $\mu$m, and wiring density 16 Pel) and electrodes 3 made of Al (film thickness 0.6 $\mu$m and width 20 $\mu$m) connected to each exothermic resistive element 2*a*.

Subsequently, the protective layer 4 of $SiO_2$/Ta (film thickness 2 $\mu$m/0.5 $\mu$m) is formed by means of sputtering method on the upper part of the portion where the electrodes and exothermic resistive elements are formed.

Figure 8:
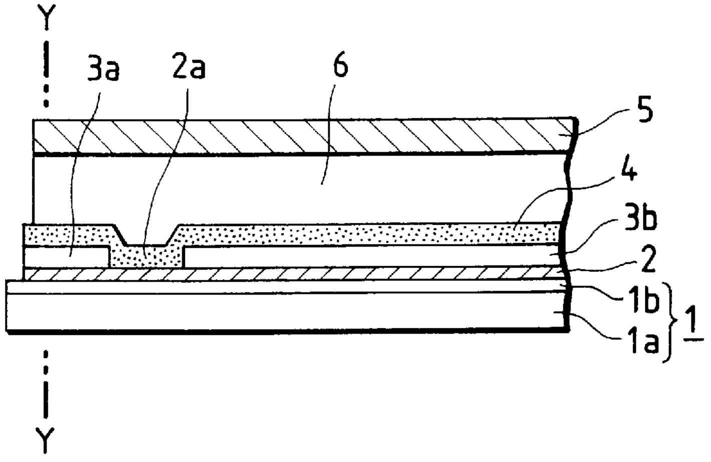
FIG. 8 is a cross-sectional view showing the principal part of a liquid jet recording head taken along its liquid passage.

Then, as shown in FIGS. 9A and 9B, the liquid passages 6, a liquid chamber 10, and others are formed with dry films. Thus, at last, the plane Y—Y (FIG. 8) where the discharging port surface is formed is cut to obtain a liquid jet recording head the structure of which is shown in FIG. 8.

Now, printing signals of 1.1 Vth and pulse width 10 $\mu$s are applied to each of the exothermic resistive elements to cause liquid to be ejected from each of the discharging ports. The cycle numbers of the electric signals are measured until a wiring of the exothermic resistive element is broken; thus making the evaluation of its durability. The durability test is executed for a head having 256 exothermic resistive elements per head, and the test is suspended the moment any one of the wirings of the exothermic resistive elements is broken.

The results thus obtained are shown in Table 2.

TABLE 2

| Heat storage layer formation surface state after thermal dioxization | Discharge durability test | | | | |
|---|---|---|---|---|---|
| | Up to each driving pulse number | | | | |
| | More than 1 μm Particle number | Required time for heat storage layer formation | Remaining head ratio | | |
| | | | $1 \times 10^7$ | $1 \times 10^8$ | $3 \times 10^8$ |
| Conventional example 1 Difference in level of approximately 0.13 μm generated Thermal dioxization at 1,150° C. for 14 hours | 0.5 pieces/cm$^2$ | 840 min | 50% | 10% | 0% |
| Conventional example 2 No significant difference in level compared to the condition before film formation $SiO_2$ bias sputtering (One-time film formation | 5 pieces/cm$^2$ | 180 min | Discharge durability disabled due to short circuit on substrate | | |
| Conventional example 3 No significant difference in level compared to the condition before the film formation $SiO_2$ bias sputtering (Two-time film formation | 5 pieces/cm$^2$ | 220 min | 80% | 50% | 20% |
| Present invention No significant difference in level compared to the condition before the film formation Bias ECR plasma CVD | 0.5 pieces/cm$^2$ | 8 min | 100% | 100% | 100% |

Whereas the liquid jet recording head which is fabricated using a polycrystalline Si substrate with the heat storage layer having the surface difference thereon due to the application of the thermal oxidation has resulted in an earlier cavitation breakage, and a polycrystalline Si substrate with the heat storage layer produced by the sputtering having many particles contained has also caused a short circuit on the substrate or an earlier cavitation breakage, the liquid jet recording head which is fabricated using the polycrystalline Si substrate having no difference on its surface has not caused any cavitation breakage at all. Also, the time required for the heat storage layer formation is significantly reduced from several hours to several minutes.

With the results mentioned above, it has been confirmed that if a head is fabricated with a substrate having the heat storage layer formed with the $SiO_2$ film which is produced by the application of the bias ECR plasma CVD film formation method subsequent to the polycrystalline Si substrate having been mirror finished, there is no problem in the heater durability test (discharge durability test), and that the processing time is significantly shortened.

Now, the description will be made of an embodiment in fabricating a substrate for a head, in which on a heat storage layer formed by thermally oxidizing a polycrystalline silicon supporting member, an $SiO_2$ layer is further deposited by the application of the bias ECR plasma CVD film formation method so as to flatten the difference in level on the heat storage layer surface.

Here, the same type of the bias ECR plasma CVD apparatus as the one described earlier can be employed.

Figure 4A:
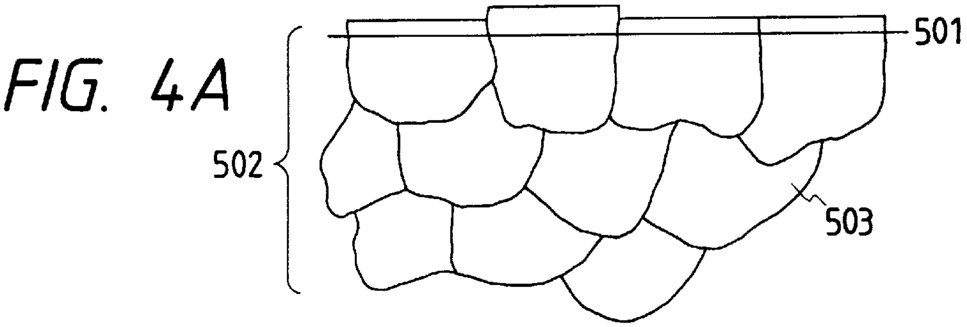
FIGS. 4A and 4B are views respectively for explaining the formation of a thermally oxidized film on the surface of a polycrystalline silicon substrate.
Figure 4B:
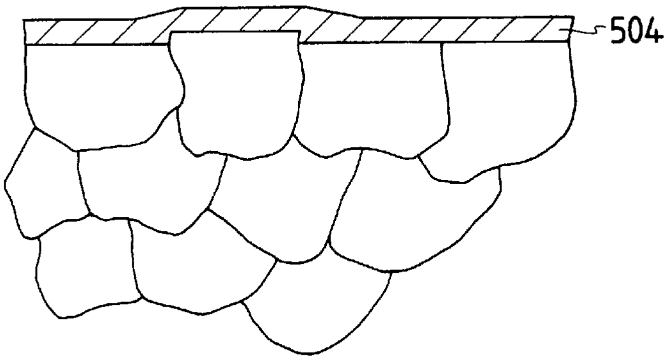

The substrate for a liquid jet recording head according to the present embodiment is the same as the one in the foregoing embodiment described in conjunction with FIGS. 1 to 2, and what differs here is that an $SiO_2$ layer deposited by the application of the bias ECR plasma CVD method is provided for the surface of the heat storage layer 1*b*. In other words, the supporting member 1 for this substrate for the liquid jet recording head is such that the surface of a polycrystalline silicon substrate is thermally oxidized (FIG. 4A) in a region shown above a reference line 501 and then the $SiO_2$ layer 504 formed on the surface of the thermally oxidized layer 503 by the application of the bias ECR plasma CVD method thereby to flatten the difference in level of the thermally oxidized layer substantially. In this respect, as shown in FIG. 4B the heat storage layer 504 is formed at least at a position on the supporting member 502 where exothermic resistive elements 2*a* are arranged. Then, on the heat storage layer 1*b* of $SiO_2$, electrodes 3 and an exothermic resistive layer 2 are patterned in a given configuration as shown in FIGS. 1A and 1B, for example, so as to form electrothermal transducers each comprising the exothermic resistive element 2*a* and electrodes 3*a* and 3*b*. Further, as required, a protective layer 4 is provided; thus obtaining a substrate 8 for a liquid jet recording head.

The substrate 8 for the liquid jet recording heat thus manufactured is used for fabricating a liquid jet recording head in accordance with the manufacturing processes described for the foregoing embodiment.

Now, the description will be made of the results of the experiments executed for the substrate for the liquid jet recording head and the liquid jet recording head according to the present embodiment.

Embodiment 2-1

At first, a polycrystalline silicon ingot is manufactured by the casting method. The granular diameter of the crystals is approximately 4 mm on the average. From this ingot, a square substrate is cut off and is finished as a mirror substrate of 300×150×1.1 (mm) with the surface roughness of 15 nm maximum by means of lap and polish machining.

Then, oxygen is introduced by a bubbling method to thermally oxidize a polycrystalline silicon substrate and is given a heat treatment at 1,150° C. for 12 hours. When the surface difference is measured by the use of a probe type roughness meter, it is recognized that the creation of the surface difference at the time of the thermal oxidation is approximately 130 nm maximum.

Subsequently, using the above-mentioned bias ECR plasma CVD apparatus shown in FIG. 11, an $SiO_2$ layer is formed with a film on the thermally oxidized layer under the conditions shown in Table 3.

TABLE 3

| Film formation conditions | |
|---|---|
| $O_2$ gas flow rate: | 120 SCCM |
| $SiH_4$ gas flow rate: | 40 SCCM |
| Microwave power: | 1 kW |
| Bias high frequency power: | 1 kW |
| Film formation chamber pressure: | 0.2 Pa |

Thus, a film thickness of 350 nm is obtained with a film formation time of 60 seconds. After the $SiO_2$ film has been formed by the application of the bias ECR plasma CVD method, the surface difference is measured by the use of a probe type roughness meter. The results are: the creation of the surface difference is less than 15 nm maximum and no significant difference is recognized as compared with the condition before the thermal oxidation.

Now, using the polycrystalline silicon substrate thus manufactured a liquid jet recording head is fabricated and the effects of the present invention are confirmed by executing the discharge durability test. At first, utilizing the photolithograph patterning technique with the structure shown in FIGS. 1A and 1B, there are formed on a polycrystalline Si substrate for fabricating a head, exothermic elements 2*a* of $HfB_2$ (20 μm×100 μm, film thickness 0.16 μm, and wiring density 16 Pel) and electrodes 3*a* and 3*b* made of Al (film thickness 0.6 μm and width 20 μm) connected to each exothermic resistive element 2*a*.

Subsequently, the protective layer 4 of $SiO_2$/Ta (film thickness 2 μm/0.5 μm) is formed by means of sputtering method on the upper part of the portion where the electrodes and exothermic resistive elements are formed. Then, as shown in FIGS. 9A and 9B, the liquid passages 6, a liquid chamber 10, and others are formed with dry films. Thus, at last, the plane Y—Y (FIG. 8) where the discharging port surface is formed is cut by slicer cutting to obtain a liquid jet recording head the structure of which is shown in FIGS. 9A and 9B.

Now, printing signals of 1.1 Vth and pulse width 10 μs are applied to each of the exothermic resistive elements to cause liquid to be ejected from each of the discharging ports. The cycle numbers of the electric signals are measured until a wiring of the exothermic resistive element is broken; thus making the evaluation of its durability. The durability test is executed for a head having 256 exothermic resistive elements per head, and the test is suspended the moment any one of the wirings of the exothermic resistive elements is broken. Also, the surface density of particles of more than 1 μm diameter developed on the surface of the heat storage layer is measured. The results thus obtained are shown in Table 4. In this respect, the total required time in Table 4 is a sum of the times necessary for conducting the thermal oxidation and the processes to follow.

[Comparison Example 2-1]

In the same manner as the embodiment 2-1, a polycrystalline silicon substrate is manufactured by the casing method and a heat storage layer is formed on the surface of this polycrystalline silicon substrate by processing it at 1,150° C. for 14 hours thereby to enable it to be a substrate which can be used for a liquid jet recording head as it is. When measuring it with a probe type roughness meter, the surface difference of the heat storage layer is approximately 130 nm maximum. Using this substrate a liquid jet recording head is fabricated in the same manner as the embodiment 2-1. Then, in the same procedures as the embodiment 2-1, the ejection durability test is executed for this liquid jet recording head. Also the surface particle density is measured. The results thereof are shown in Table 4.

[Comparison Example 2-2]

In the same manner as the embodiment 2-1, a polycrystalline silicon substrate is manufactured by the casing method and a heat storage layer is formed on the surface of this polycrystalline silicon substrate by processing it at 1,150° C. for 12 hours. Subsequently, by means of the bias sputtering, an $SiO_2$ is deposited on the surface of the heat storage layer to make it a substrate to be used as the substrate for a liquid jet recording head. When measuring it with a probe type roughness meter, there is no significant difference being recognized as to the surface difference of the heat storage layer as compared with the condition before the thermal oxidation. Using this substrate a liquid jet recording head is fabricated in the same manner as the embodiment 2-1. Then, in the same procedures as the embodiment 2-1, the ejection durability test is executed for this liquid jet recording head. Also the surface particle density is measured. The results thereof are shown in Table 4.

TABLE 4

| | Processing condition | Surface state after processing | Number of particles of more than 1 μm diameter (pieces/$cm^2$) | Total time required (Time) | Remaining ratio of exothermic resistive elements up to each driving pulse number: $1 \times 10^7$ | $1 \times 10^8$ | $3 \times 10^8$ |
|---|---|---|---|---|---|---|---|
| Embodiment 4-1 | Thermal oxidation at 1,150° C. for 12 hours + bias ECR plasma CVD | No significant difference from the condition before thermal oxidation | 0.5 | 12.02 | 100% | 100% | 100% |
| Comparison example 4-1 | Thermal oxidation at 1,150° C. for 14 hours | Difference in level of approximately 0.13 μm generated | 0.5 | 14 | 50% | 10% | 0% |
| Comparison | Thermal oxidation | No significant | 5 | 12.7 | 80% | 50% | 20% |

TABLE 4-continued

| | Processing condition | Surface state after processing | Number of particles of more than 1 μm diameter (pieces/cm$^2$) | Total time required (Time) | Remaining ratio of exothermic resistive elements up to each driving pulse number $1 \times 10^7$ | $1 \times 10^8$ | $3 \times 10^8$ |
|---|---|---|---|---|---|---|---|
| example 4-2 | at 1,150° C. for 12 hours + bias sputtering | difference from the condition before thermal oxidation | | | | | |

As clear from Table 4, when a polycrystalline silicon substrate formed by the conventional technique having difference in level on its surface or many numbers of particles contained is used, and a liquid jet recording head is fabricated using this polycrystalline silicon substrate, an earlier cavitation breakage has resulted. In-contrast, when a polycrystalline silicon substrate manufactured by the method according to the present invention with the surface difference having been flattened, and a liquid jet recording head is fabricated using this polycrystalline silicon substrate, no cavitation breakage has taken place at all.

From the results mentioned above, it has been confirmed that a polycrystalline silicon substrate is thermally oxidized and then an $SiO_2$ film is formed thereon by the application of the bias ECR plasma CVD film formation method thereby to flatten the substrate, although it can be flattened by some other methods, and a liquid jet recording head fabricated using such a substrate demonstrates a desirable condition particularly in its heater durability test (discharge durability test) as compared with some other film formation methods.

The description has been made of a second embodiment according to the present invention so far, but the configuration of the exothermic portions and the structure of the protective layer, and others are not confined to those shown in the respective figures. The structure of the liquid jet recording head is not limited to the one shown in FIG. 12, either. For example, the example shown in FIGS. 9A and 9B is structured to arrange the direction in which liquid is ejected from the discharging ports and the direction in which liquid is supplied to the location in the liquid passages where the exothermic portions are provided for the thermal energy generating elements to be substantially the same, but the present invention is not limited thereto. For example, it may be applicable to a liquid jet recording head having the foregoing two directions different from each other (substantially vertical, for example).

Figure 5:
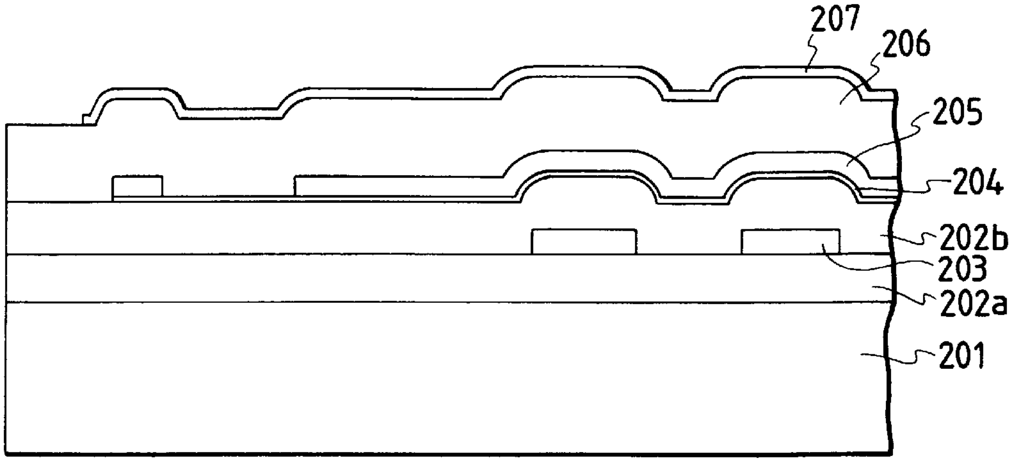
FIG. 5 is a cross-sectional view showing the structure of a substrate for the liquid jet recording head.

Now, the description will be made of a substrate for a liquid jet recording-head with films being formed by the application of the bias ECR plasma CVD method to be arbitrarily used for an insulation between layers, protection, or the like. The bias ECR plasma CVD apparatus to be used for the present embodiment is the same as the one used for the foregoing embodiments described in conjunction with FIG. 11. FIG. 5 is a cross-sectional view showing the structure of the substrate for a liquid jet recording head fabricated by the use of the bias ECR plasma CVD apparatus shown in FIG. 11.

The fundamental structure of the substrate for a liquid jet recording head shown in FIG. 5 is the same as a conventional one shown in FIG. 12 having a two-layered matrix type wiring layer. In other words, an $SiO_2$ first heat storage layer 202*a* is formed on a silicon substrate 201, and on the upper part thereof, an aluminum lower wiring layer 203 is formed in the transversal direction for driving heaters (exothermic portions) in matrix. The upper plane of the first heat storage layer 202*a* with the lower wiring layer 203 being formed is covered with an $SiO_2$ second heat storage layer (insulation film between layers) 202*b,* and there are sequentially deposited on it, an exothermic resistive layer 204 which constitutes the exothermic portions and an aluminum electrode layer 205. Further, an $SiO_2$ protection layer 206 and an anti-cavitation layer 207 made of tantalum and others are deposited. Here, the second heat storage layer 202*b* and protection layer 206 are deposited and formed by the application of the bias ECR plasma CVD method.

Now, the description will be made of the results of the aptitude test for the $SiO_2$ layer formed by the application of the bias ECR plasma CVD method for the substrate for a liquid jet recording head.

[Test 1 (Basic Test)]

An $SiO_2$ layer used for the above-mentioned substrate for a liquid jet recording head is manufactured under conditions shown in Table 5. In this case, the $SiO_2$ layer is deposited to cover the stepping portion, the above-mentioned lower wiring layer 203, for example.

TABLE 5

| Film formation conditions | |
|---|---|
| $O_2$ gas flow rate: | 120 SCCM |
| $SiH_4$ gas flow rate: | 40 SCCM |
| Microwave power: | 1 kW |
| Bias high frequency power: | 1 kW |
| Film formation chamber pressure: | 0.2 Pa |

Figure 6:
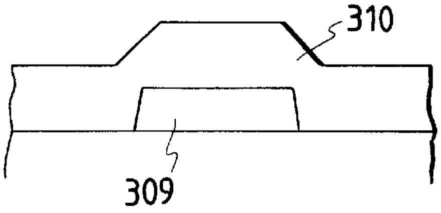
FIG. 6 is a view showing a sectional configuration of an $SiO_2$ film having the difference in level due to an aluminum wiring.

In this case, the film formation velocity obtained is 350 nm/min. When the $SiO_2$ film thus formed is evaluated, the following results are obtained:

(1) Configuration of the stepping portion:

The configuration is as shown in FIG. 6. The $SiO_2$ film 310 flattens the stepping portion due to the aluminum wiring 309 and it represents a similar configuration to the film formed by means of bias sputtering.

(2) Film quality in the stepping portion:

The sectional face of the substrate formed is soft etched with a hydroflouric acid etching solution. When it is observed by the use of an SEM (scanning type electronic microscope), no cracks nor streams are noticed. In other words, the film quality in the stepping portion and that in the flat portion are completely equal.

(3) Film quality:

With the above-mentioned etching solution, the ratio of the etching velocities with respect to a thermally oxidized $SiO_2$ film. The result is 1.4 times and the specimen is regarded as a minute film considerably close to the $SiO_2$ film formed by means of the thermal oxidation.

(4) Refraction factor:

When observed by an ellipsometer (light source: He—Ne, laser wavelength: 632.8 nm), the refraction factor is 1.48 to 1.50, which is slightly higher than the thermally oxidized $SiO_2$ film (1.46).

(5) O/Si atomic ratio:

With an EPMA (electronic probe minute analysis), the O and Si atomic ratio is determined quantitatively. Then, O/Si=2.0. The specimen can be regarded as a complete $SiO_2$.

(6) Stress:

The stress is measured based on the warping amount of the substrate. The result is: a compressed stress of $-5\times10^9$ dyn/cm$^2$.

[Test 2 (Test as a protection film)]

Under the same conditions as the test 1, an $SiO_2$ protection layer 206 is deposited for 1.0 μm and then tantalum is deposited for 600 nm thereon as an anti-cavitation layer 207. Thus, the substrate for a liquid jet recording head is manufactured. Using this substrate for a liquid jet recording head, a liquid jet recording head is trially fabricated and its durability is confirmed. As a result, this specimen demonstrates a performance equivalent-to the current product, that is, the liquid jet recording head having the $SiO_2$ film formed by means of bias sputtering method in the step-stress test, fixed-stress test, and in the ejection durability test as well. There is no problem at all with respect to its durability.

[Test 3 (Test as an insulation film between layers)]

Under the same conditions as the test 1, an insulation film between layers, that is, the second heat storage layer 202*b* in FIG. 5, is deposited for a thickness of 1.2 μm. In the process thereafter, it is prepared in the same manner as the conventional substrate for a liquid jet recording head thereby to trially fabricate a liquid jet recording head (the $SiO_2$ protection film 206 is formed by means of bias sputtering method).

Then, the insulation breakage strength is measured in terms of a liquid jet recording head. Here, the insulation breakage strength means the insulation breakage strength of the insulation film between layers, that is, the second heat storage layer 202*b*. As a result, the insulation breakage strength is 500V which is approximately equivalent to the $SiO_2$ film formed by means of bias sputtering method. Compared to the insulation breakage strength (~1,000V) of the film formed by means of plasma CVD method, this is low but this is due to the fact that the film thickness of the $SiO_2$ film becomes thinner substantially at the stepping portion on the second heat storage layer 202*b* when the bias is applied. Conceivably, it is not any problem attributable to its film quality.

Also, if the second heat storage layer 202*b* is formed as $SiO_2$ film by means of plasma CVD method, the time required for etching the side wall of the stepping portion is more than four times that for etching the flat portion when the exothermic resistive layer 204 deposited on this second heat storage layer 202*b* is dry etched with RIE (reactive ion beam etching) for the pattern formation. In contrast, the time required for etching this trially formed film is only 1.5 times. This is due to the fact that the configuration of the stepping portion is inclined as shown in FIG. 6. Thus, even for an anisotropic etching such as RIE, it does not take so much time. Also, with respect to the repeated thermal stresses caused by the exothermic portion, the specimen demonstrates a sufficient durability nor there is any problems as to the durability and reliability as a liquid jet recording head (the same durability as the $SiO_2$ film formed by means of bias sputtering method).

As described above, the $SiO_2$ film formed by the application of the bias ECR plasma CVD method has substantially the same performance as the one formed by means of bias sputtering when it is used as an insulation film between layers.

The following two points are the principal differences of the bias ECR plasma CVD method from the bias sputtering method:

(1) Lesser generation of particles

If particles exist in the $SiO_2$ film on the exothermic surface, cracks tend to take place in the $SiO_2$ film in such portion where the particles exist due to the cavitation damage resulting form the repeated ejection although insulation is effective between ink and heaters at its initial stage. If cracks occur, ink is permeated such cracked portions to cause electrolytic corrosion to the heater portions. Also, the projected part of the particle can be a bubbling nucleus at the time of ink bubbling so as to hinder stable film boiling in some cases. The size of such particle on the exothermic portion must be less than approximately 1 μm in diameter and also, the density of such particles must be kept low.

For the film formed by means of bias sputtering, the density of particles can not be reduced to approximately more than 5 pieces/cm$^2$ even if the film formation chamber is cleaned. The bias sputtering conditions in this case are: the film formation factor on the cathode side is 180 nm/min; the etching factor on the bias side, 30 nm/min; and the total film formation velocity, 150 nm/min. The film formation velocity and particle density are positively interrelated, and if the film formation velocity is made faster, the processing capability is increased, but the number of particles is also increased. This is conceivably due to the abnormal discharge which will be generated when a large RF power is applied to the target.

In contrast, with the bias ECR plasma CVD method, only $O_2$ gas or a mixed gas of $O_2$ and Ar are in the plasma generation chamber and-the $SiO_2$ film formation results from the reaction between the $O_2$ gas and $SiH_4$ gas. Therefore, if only the interior of the film formation chamber is kept clean, particles can rarely be generated. According to the test results, the generation of particles can be inhibited to a 1/10 of those created when the bias sputtering is applied. Also, the film formation chamber is stained by the adhesive particles when film formation is repeatedly performed whereas it is difficult to clean its interior completely because the interior cleaning is complicated due to the presence of the target and target shield. On the other hand, for the ECR plasma CVD method, the structure of the film formation chamber can be made substantially simple only by providing a substrate holder in it and at the same time, most of the particles adhere only to the vicinity of the substrate holder; thus making it easy to clean the interior thereof. Further, if $CF_4$, $C_2F_6$, or similar gas is introduced as plasma in place of the $O_2$ gas, it is also possible to give etching to the films adhering to the interior of the film formation chamber. Thus, from the view point of an easier cleaning, this method is excellent in reducing the number of particles which creates the problem with respect to the durability of the liquid jet recording head.

(2) Faster film formation velocity

As described regarding the test 1, the film formation velocity of the bias ECR plasma CVD method is 350 nm/min, while in the case of the sputtering method, 200 nm/min is considered maximum with the current technique in view because if the RF power to be applied to the cathode (target) is increased greatly, the target is broken or abnormal discharge is generated. Therefore, it is possible for the bias ECR plasma CVD method to form films having lesser number of particles at high speeds.

[Test 4 (changes in bias power)]

The description will be made of the results of film formation by changing the bias powers midway in applying the bias ECR plasma CVD method. The bias power is set at 1 kW at the initiation of the film formation. Then, in the same manner as the test 1, an $SiO_2$ protection layer 206 is formed. When the film is formed by 0.5 μm, the bias power is changed to 500 W to further perform the film formation by another 0.5 μm. The film formation conditions are as shown in Table.

TABLE 6

| Conditions on the film formation | |
|---|---|
| $O_2$ gas flow rate: | 120 SCCM |
| $SiH_4$ gas flow rate: | 40 SCCM |
| Microwave power: | 1 kW |
| Bias power: (1) kW (2) 500 W | |
| Film formation chamber pressure: | 0.2 Pa |

Figure 7A:
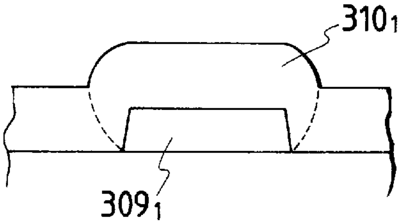
FIGS. 7A and 7B are views respectively showing a sectional configuration of an $SiO_2$ film having the difference in level due to an aluminum wiring.
Figure 7B:
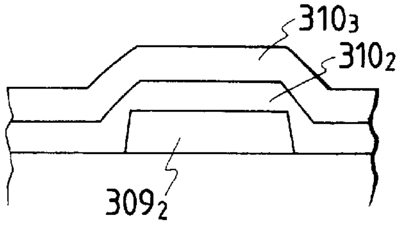

A liquid jet recording head is fabricated using the substrate for a liquid jet recording head thus obtained. There are no difference in performance as well as in durability. An excellent liquid jet recording head is obtainable. When the bias power is 1 kW, the film formation velocity is 350 nm/min, and 0.5 kW, 450 nm/min. In the case of 0.5 kW, its throughput is better, but the film quality of the $SiO_2$ film $310_1$ provided on the aluminum wiring $209_1$ as shown in FIG. 7A becomes degraded in the portion indicated by dotted lines if the bias power is lowered, and when etched by use of a hydrofluoric acid solution, such a-portion becomes easily etched. However, as shown in FIG. 7B, if the $SiO_2$ film $310_2$ is formed over the aluminum wiring $309_2$ initially at the 1-kw bias power to make the inclination of-the stepping portions easy, the film quality of the $SiO_2$ film $310_3$ formed thereafter at the 0.5-kW bias power is not degraded even in the stepping portions; thus obtaining a desirable film, at the same time enabling its throughput to be increased. Also, it is possible to increase the step coverage. Therefore, its dielectric strength is also enhanced.

[Test 5 (Ar gas introduction)]

As shown in Table 7, an $SiO_2$ film is deposited with the introduction of argon to the plasma generation chamber in addition to oxygen.

TABLE 7

| Conditions on the film formation | |
|---|---|
| $O_2$ gas flow rate: | 120 SCCM |
| $SiH_4$ gas flow rate: | 40 SCCM |
| Ar gas flow rate: | 50 SCCM |
| Microwave power: | 1 kW |
| Bias RF power: | 1 kW |
| Vacuum: | 0.25 Pa |

The film formation velocity is changed to 300 nm/min. from 350 nm/min where no Ar gas is introduced. Under these conditions, a protection layer 206 is deposited for 1.0 μm and then a tantalum anti-cavitation layer 207 is formed. Thus, a liquid jet recording head is trially fabricated and a step-stress test, fixed-stress test, and ejection durability test are conducted to evaluate its characteristics. There is no problem in any aspect.

In this respect, the description will be made of the difference due to the amount of RF power application on the bias side in the bias ECR plasma CVD method. When no bias is applied, a film of low minuteness is formed in the stepping portion as in the case of the film formed by means of the ordinary plasma CVD or sputtering method. However, if a bias is applied so that the etching velocity becomes approximately 5% of the film formation velocity, the film quality in the stepping portion will be improved. Also, if the bias is applied too much, the substantial film formation velocity is lowered and then a problem is encountered that the coverage over the stepping portion is lowered. Its application, therefore, should desirably be defined to be 5% to 50% of the film formation velocity at the time of no bias being applied (the film formation velocity: 0.95 to 0.5).

From the results of the above-mentioned tests 1 to 5, it is clear that according to the bias ECR plasma CVD method, an $SiO_2$ layer of a desirable film quantity to be used for the substrate for a liquid jet recording head can be formed at high film formation velocity.

So far an example has been described in which a film formed by means of the bias ECR plasma CVD method is used for the substrate for a liquid jet recording head, but there is an effect that the composition ratio of the film formed by the application of this film formation method can be approximated to stoichiometric ratio.

Table 7 shows the composition ratios when an $SiO_2$ film and $Si_3N_4$ film are formed by the application of each film formation method.

TABLE 7

| Film formation method | Material gas | Target Sputtering gas | Composition ratio O/S | Composition ratio N/S |
|---|---|---|---|---|
| Bias ECR-P-CVD | $SiH_4 + O_2$ | — | 1.996 | — |
| P-CVD | $SiH_4 + N_2$ | — | 1.656 | — |
| Bias sputtering | — | $SiO_2$ Ar | 1.961 | — |
| Sputtering | — | $SiO_2$ Ar | 1.950 | — |
| Bias ECR-P-CVD | $SiH_4 + N_2$ | — | — | 1.345 |
| P-CVD | $SiH_4 + NH_4$ | — | — | 0.875 |
| Bias sputtering | — | $Si_3N_4$ Ar | — | 1.126 |
| Sputtering | — | $Si_3N_4$ Ar | — | 1.056 |
| Stoichiometric ratio | | | 2.000 | 1.333 |

Here, the respective film formation conditions are as follows:

TABLE 8

| | $SiO_2$ film | $Si_3N_4$ film |
|---|---|---|
| Bias ECR-P-CVD | | |
| $O_2$ gas flow rate | 120 SCCM | — |
| $N_2$ gas flow rate | — | 120 SCCM |
| $SiH_4$ gas flow rate | 40 SCCM | 40 SCCM |
| Microwave power | 1 kW | 1 kW |
| Bias high frequency | 1 kW | 1 kW |
| Film formation chamber pressure | 0.2 Pa | 0.2 Pa |
| P-CVD | | |
| $SiH_4$ gas flow rate | 40 | 40 |
| $N_2O$ gas flow rate | 80 | — |
| $NH_4$ | — | 80 |
| RF power | 1 kW | 1 kW |

TABLE 9

| | $SiO_2$ film | $Si_3N_4$ film |
|---|---|---|
| Bias sputtering | | |
| Target | $SiO_2$ | $Si_3N_4$ |
| Sputtering gas | Ar 100 SCCM | Ar 100 SCCM |
| RF power | 2 kW | 2 kW |
| Bias | 200 W | 200 W |
| Sputtering | | |
| Target | $SiO_2$ | $Si_3N_4$ |
| Sputtering gas | Ar 100 SCCM | Ar 600 SCCM |
| RF power | 2 kW | 2 kW |

From Table 7 it is clear that compared to other film formation methods, the bias ECR plasma CVD method has a small deviation in its composition ratio.

When this film is used as a protection film, the insulation between layers will be further improved, and there is no fear among others that the anti-cavitation layer (Ta) and electrodes will be short circuited. This improvement of the insulating capability is particularly conspicuous in the stepping portions. Also, with this improvement of the insulating capability, it is possible to significantly reduce possible damages caused by ink ion to the wiring electrodes and heaters.

Also, when this film is used for a heat storage layer, there is no possibility that short circuit will take place between the wiring electrodes and the supporting member and the like even when the material of the supporting member has a good electric conductivity.

Then, a desirable composition ratio of a film to be used such an ink jet recording head as this is: For $SiO_2$, O/Si is 1,970 to 2,000, and for $Si_3N_4$, N/Si is 1,200 to 1,333. It is desirable that the conditions to satisfy such ratio are: For the bias ECR Plasma CVD method.

| | |
|---|---|
| Microwave power: | 100 W to 10 kW |
| Bias high frequency power: | 50 W to 3 kW |
| Gas pressure: | 0.01 Pa to 2 Pa |
| Gas flow ratio: | for $SiO_2$, $O_2/SiH_4$ ratio more than 1.0<br>for $Si_3N_4$, $N_2/SiH_4$ ratio more than 0.7 |

Subsequently, the description will be made of an embodiment of a liquid jet recording head according to the present invention. Although this liquid jet recording head is the same as the liquid jet recording head described above in conjunction with FIGS. 9A and 9B, it uses, as its substrate for the liquid jet recording head, an embodiment of a substrate for a liquid jet recording head according to the present invention. FIG. 8 is a view for explaining a manufacturing method for this liquid jet recording head.

For this liquid jet recording head, a substrate 8 (FIGS. 9A and 9B) for a liquid jet recording head is formed and then on this substrate for a liquid jet recording head, a ceiling plate 5 integrally formed with liquid passages 6 and a liquid chamber 10 (not shown in FIG. 8), a liquid supply inlet 9 (not-shown in FIG. 8) is formed in a photolithographic process using dry films. After that, by cutting at a location for the discharging ports 7 at the leading end of the liquid passages 6 (along lines Y—Y in FIG. 8), the discharging ports 7 are formed thereby to fabricate this liquid jet recording head. Each of the exothermic resistive elements 2*a* of the substrate 8 for a liquid jet recording head is positioned at the bottom portion of the corresponding liquid passage 6 as a matter of course.

Now, the description will be made of the operation of this liquid jet recording head. Ink or other recording liquid is supplied to the liquid chamber 10 from a liquid reservoir (not shown) through the liquid supply inlet 9. The recording liquid supplied into the liquid chamber 10 is supplied to the liquid passages 6 by the capillary phenomenon and is stably held at the discharging ports 7 located at the leading end of the liquid passages 6 with the meniscus formation. Here, by applying a voltage across the electrodes 3*a* and 3*b*, the exothermic resistive element 2*a* is energize to generate heat. Thus, liquid is heated through the protection layer 4 to give bubbles. With the bubbling energy thus exerted, liquid droplets are ejected from the discharging ports 7. Also, 128 or 256 or more discharging ports 7 can be formed with a high density of 16 pieces/mm. Furthermore, it can be made a full-line head by forming it in a number good enough to cover the entire width of the recording area of a recording medium.

The present invention will produce excellent effects on ink jet recording methods, particularly on an ink jet recording type recording head as well as a recording apparatus which performs recording by utilizing thermal energy for the formation of flying droplets.

Regarding the typical structure and operational principle of such a method; it is preferable to adopt those which can be implemented using the fundamental principle disclosed in U.S. Pat. Nos. 4,723,129 and 4,740,796. This method is applicable to a so-called on-demand type recording system and a continuous type recording system.

To explain this recording method briefly, at least one driving signal, which provides liquid (ink) with a rapid temperature rise beyond a departure from nucleation boiling point in response to recording information, is applied to an electro-thermal transducer disposed on a liquid (ink) retaining sheet or liquid passage whereby to cause the electro-thermal transducer to generate thermal energy to produce film boiling on the thermoactive portion of the recording head for the effective formation of a bubble in the recording liquid (ink) corresponding to each of the driving signals. Thus, this is particularly effective for the on-demand type recording method. By the production, development and contraction of the bubble, the liquid (ink) is ejected through a discharging port to produce at least one droplet. The driving signal is preferably in the form of a pulse because the development and contraction of the bubble can be effected instantaneously, and therefore, the liquid (ink) is ejected with quick response. The driving signal in the form of the pulse is preferably such as disclosed in U.S. Pat. Nos. 4,463,359 and 4,345,262. In this respect, it is possible to perform excellent recording in a better condition if the temperature increasing rate of the thermoactive surface is adopted as disclosed in U.S. Pat. No. 4,313,124.

The structure of the recording head may be as disclosed in the above-mentioned U.S. patent specifications such as combining the discharging ports, liquid passages, and the electrothermal transducers (linear type liquid passages or right angled liquid passages). Besides, the structure with the thermoactive portion being arranged in a curved area such as disclosed in U.S. Pat. Nos. 4,558,333 and 4,459,600 is also included in the present invention.

In addition, the present invention is effectively applicable to the structure disclosed in Japanese Patent Laid-Open Application No. 59-123670 wherein a common slit is used as the discharging port for plural electrothermal transducers, and to the structure disclosed in Japanese Patent Laid-Open Application No. 59-138461 wherein an opening for absorbing pressure wave of the thermal energy is formed corresponding to the ejecting portion.

Further, as a recording head for which the present invention can be fully utilized, there is a full-line type recording head having a length corresponding to the maximum width of a recording medium recordable by a recording apparatus. This full-line recording head can be structured either by combining a plurality of such recording heads as disclosed in the above-mentioned patent specifications or an integrally structured single full-line recording head.

In addition, the present invention is applicable to a replaceable chip type recording head which is connected electrically with the main apparatus and can be supplied with the ink when it is mounted in the main assembly, or to a cartridge type recording head having an integral ink container.

Also, it is preferable to add the recording head recovery means and preliminarily auxiliary means which are provided as constituents of a recording apparatus according to the present invention. They will contribute to making the effects of the present invention more stable. To name them specifically, they are capping means for the recording head, cleaning means, compression or suction means, preliminary heating means such as electrothermal transducers or heating elements other than such transducing type or the combination of those types of elements, and the preliminary ejection mode besides the regular ejection for recording.

Moreover, the present invention is extremely effective in its application to an apparatus having at least one of the monochromatic mode mainly with black, multi-color mode with different color ink materials and/or full-color mode using the mixture of the colors, which may be an integrally formed recording unit or a combination of plural recording heads.

Now, in the embodiments according to the present invention set forth above, while the ink has been described as liquid, it may be an ink material which is solidified below the room temperature but liquefied at the room temperature. Since the ink is controlled within the temperature not lower than 30° C. and not higher than 70° C. to stabilize its viscosity for the provision of the stabilized ejection in general, the ink may be such that it can be liquefied when the applicable recording signals are given.

In addition, while preventing the temperature rise due to the thermal energy by the positive use of such energy as an energy consumed for changing states of the ink from solid to liquid, or using the ink which will be solidified when left intact for the purpose of preventing ink evaporation, it may be possible to apply to the present invention the use of an ink having a nature of being liquefied only by the application of thermal energy such as an ink capable of being ejected as ink-liquid by enabling itself to be liquefied anyway when the thermal energy is given in accordance with recording signals, an ink which will have already begun solidifying itself by the time it reaches a recording medium.

For an ink such as this, it may be possible to retain the ink as a liquid or solid material in through holes or recesses formed in a porous sheet as disclosed in Japanese Patent Laid-Open Application No. 54-56847 or Japanese Patent Laid-Open Application No. 60-71260 in order to exercise a mode whereby to enable the ink to face the electrothermal transducers in such a state.

For the present invention, the most effective method for each of the above-mentioned ink materials is the one which can implement the film boiling method described above.

Figure 10:
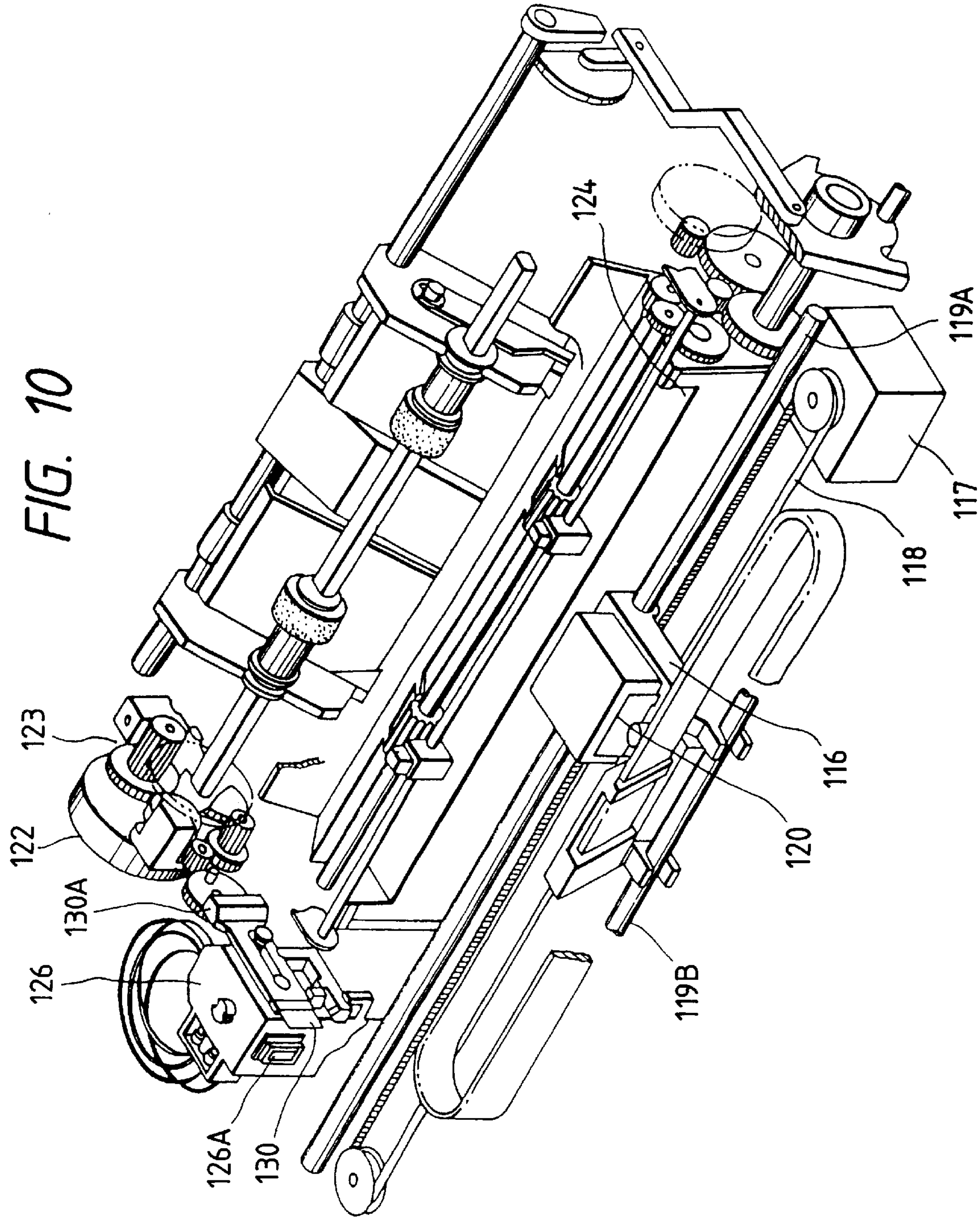
FIG. 10 is a perspective view showing the outer appearance of an example of a liquid jet recording apparatus provided with a liquid jet recording head according to the present invention.

FIG. 10 is a perspective view showing the outer appearance of an example of the ink jet recording apparatus (IJRA) in which a recording head obtainable according to the present invention is installed as an ink jet head cartridge (IJC).

In FIG. 10, a reference numeral 120 designates an ink jet head cartridge (IJC) provided with a nozzle group capable of ejecting ink onto the recording surface of a recording sheet being fed on a platen 124; 116, a carriage HC to-hold the IJC 120 and is coupled to a part of a driving belt 118 to transmit the driving power of a driving motor 117, which is slidable with respect to two guide shafts 119*a* and 119*b* arranged in parallel to each other so as to enable the IJC 120 to move reciprocally over the entire width of a recording sheet.

A reference numeral 126 designates a head recovery device arranged at one end of the carrier passage of the IJC 120, that is, a location facing its home position, for example. The head recovery device 126 is operated by the driving power of a motor 122 through a transmission mechanism 123 to perform the capping for the IJC 120. Being interlocked with the capping for the IJC 120 by means of the capping portion 126A of this head recovery device 126, an arbitrary sucking means arranged in the head recovery device 126 sucks ink or an arbitrary pressuring means arranged in the ink supply passage for the IJC 120 pressures ink to be carried so that ink is ejected forcibly for discharge; thus performing the removal of the ink which has become more viscous in nozzles, and other ejection recovery treatments. Also, when recording is at rest, capping is provided for the protection of the IJC.

A reference numeral 130 designates a blade arranged on the side face of the head recovery device 126, made of silicon rubber to serve as a wiping member. The blade 130 is held by a blade holding member 130A in cantilever fashion to be operated by means of the motor 122 and transmission mechanism 123 in the same manner as the head recovery device 126. It is capable of being coupled with the discharging surface of the IJC 120. In this way, the blade 130 is allowed to be projected in the traveling passage of the IJC 120 with an appropriate timing while the IJC 120 is in operation or subsequent to the ejection recovery treatment using the head recovery device 126; thus making it possible to wipe dews, wets or dust particles along with the traveling operation of the IJC 120.

With the structure described above, the present invention displays effects set forth below. (1) It is possible to implement a polycrystalline silicon substrate manufacturable in large sizes-with an excellent radiation capability and cost performance by thermally oxidizing the polycrystalline silicon substrate and then forming an $SiO_2$ film by the application of the bias ECR plasma CVD film formation method thereby to flatten it; thus (2) it becomes possible to implement a liquid jet recording head having an excellent durability at a low manufacturing cost.

With an $SiO_2$ layer deposited by the application of the bias ECR plasma CVD method on the substrate for a liquid jet recording head, a desirable configuration of the wiring stepping portions as well as a desirable film quality can be obtained so as to make the surface configuration smooth. Accordingly, there are effects that the film formation velocity becomes faster and the ejection is stabilized with a higher durability. Also, there is an effect that by lowering a bias power midway in a film formation, it is possible to manufacture the substrate for a liquid jet recording head having the above-mentioned effects with a high throughput as well as a high yield. Moreover, by controlling-the bias power so as to define the film formation velocity to be 0.5 to 0.95 when it does not add any bias; thus improving the film formation velocity as well as producing an effect that the film quality in the stepping portion is improved.

What is claimed is:

1. A method of manufacturing a substrate for a liquid jet recording head, said method comprising the steps of:

providing a polycrystalline silicon substrate;

forming a first portion of a heat accumulating layer on said substrate, said first portion of said heat accumulating layer having steps in a surface thereof;

then, by means of a bias ECR plasma CVD technique, forming a second portion of said heat accumulating layer on said surface of said first portion of said heat accumulating layer to flatten said steps in said surface;

forming a heat generating resistance layer on the flat surface of said second portion of said heat accumulating layer, said heat generating resistance layer having a flat portion constituting a flat heat generating resistance member; and thereafter providing on the heat generating resistance layer, a wiring layer comprising spaced apart electrodes between which electrical current is directed through said flat heat generating resistance member for generating heat in response to an electrical signal applied to said electrodes.

2. A method according to claim 1, further including the step of forming, by means of a bias ECR plasma process, a protective layer on said heat generating resistance layer.

3. A method according to claim 1 further including the step of forming a second heat accumulating layer and a second wiring layer above said first and second portions of said heat accumulating layer, said heat generating resistance layer, and said wiring layer.

4. A method according to claim 3, further including the step of forming, by means of a bias ECR plasma process, a protective layer on said second wiring layer layer.

5. A method according to claim 4, further including the step of forming a plurality of discharge ports over said electrodes to form a full line recording head.

6. A method according to claim 1, wherein at least one of said heat accumulating layer portions is silicon dioxide.

7. A method according to claim 1 wherein said heat accumulation layer is formed by means of thermal oxidation of the surface of said polysilicon substrate.

8. A method according to claim 1 wherein said polysilicon substrate is polished to a mirror finish before forming a heat accumulating layer on said substrate.

* * * * *

UNITED STATES PATENT AND TRADEMARK OFFICE
CERTIFICATE OF CORRECTION

PATENT NO. : 6,149,986
DATED : November 21, 2000
INVENTOR(S) : Makoto Shibata et al.

It is certified that error appears in the above-identified patent and that said Letters Patent is hereby corrected as shown below:

Title page,
Item [56], REFERENCES CITED AT FOREIGN PATENT DOCUMENTS
"3024268" should read -- 3-024268 --, Column 1,
Line 8, "tiled" Oct. 15, 1993" should read -- filed Oct. 15, 1992 --;
Line 32, "a" (second occurrence) should be deleted;
Line 37, "use" should read -- use in --.

Column 2,
Line 44, "defectives." should read -- defects. --;
Line 45, "defectives," should read -- defects, --;
Line 52, "occur" should read -- occurs --;
Line 66, "defectives" should read -- defects --.

Column 4,
Lines 36 and 39, "defectives" should read -- defects --;

Column 5,
Line 34, "acutely" should read -- an acutely --.

Column 7,
Line 3, "becomes" should be deleted;
Line 4, "velocity);" should read -- velocity becomes); --;
Line 16, "defectives" should read -- defects --;
Line 18, "defectives," should read -- defects, --

Column 9,
Line 28, "Ξm" should read -- $\mu$m --.

Column 10,
Line 31, "guide 413," should read -- guide 313, --.

Column 11,
Line 41, "Tat" should read -- Ta, --;
Line 43, "other," should read -- others, --.

UNITED STATES PATENT AND TRADEMARK OFFICE
CERTIFICATE OF CORRECTION

PATENT NO. : 6,149,986
DATED : November 21, 2000
INVENTOR(S) : Makoto Shibata et al.

It is certified that error appears in the above-identified patent and that said Letters Patent is hereby corrected as shown below:

Column 12,
Line 8, "28,000 A" should read -- 28,000 Å --;
Line 41, "$\mu$n" should read -- $\mu$m --;
Line 55, "FIG. 12." should read -- FIG. 9A. --.

Column 13,
Table 1, "film formation" should read -- film formation) --;
Line 34, "defectives" should read -- defects --;
Line 58, "300'150x1.1" should read -- 300x150x1.1 --.

Column 14,
Line 35, "is" should read -- are --.

Column 15,
Table 2, "(One-time film formation" should read -- (One-time film formation) --;
"(Two-time film formation" should read -- (Two-time film formation) --;
"dioxization" (both occurrences) should read -- dioxidation --.

Column 16,
Line 49, "heat" should read -- head --.

Column 18,
Line 36, "an" should be deleted.

Column 19,
Line 20, "In-contrast," should read -- In contrast, --;
Line 52, "recording-head" should read -- recording head --.

Column 20,
Line 57, "hydroflouric" should read -- hydrofluoric --.

Column 21,
Line 8, $SiO_2$." should read -- $SiO_2$ film. --;
Line 21, "equivalent-to" should read -- equivalent to --;
Line 62, "nor there is any" should read -- Also, there are no --.

UNITED STATES PATENT AND TRADEMARK OFFICE

CERTIFICATE OF CORRECTION

PATENT NO. : 6,149,986
DATED : November 21, 2000
INVENTOR(S) : Makoto Shibata et al.

It is certified that error appears in the above-identified patent and that said Letters Patent is hereby corrected as shown below:

Column 22,
Line 11, "form" should read -- from --;
Line 13, "is permeated" should read -- permeates --;
Line 21, "can not" should read -- cannot --;
Line 35, "and-the" should read -- and the --.

Column 23,
Line 9, "Table." should read -- Table 6. --;
Table 6, "Bias power: (1)1kW (2) 500 W" should read -- Bias power: (1) 1kW (2) 500 W --;
Line 22, "difference" should read -- differences --;
Line 27, "wiring $209_1$" should read -- $309_1$ --;
Line 30, "a-portion" should read -- a portion --;
Line 34, "of-the" should read -- of the --;
Line 55, "nm/min." should read -- nm/min --.

Column 25,
Line 61, "(not-shown" should read -- not shown --.

Column 26,
Line 12, "energize" should read -- energized --.

Column 27,
Line 52, "ink-liquid" should read -- ink liquid --.

Column 28,
Line 6, "to-hold" should read -- to hold --;
Line 45, "sizes-with" should read -- sizes with --;
Line 63, "controlling-the" should read -- controlling the --

Column 29,
Line 16, "member; and" should read -- member; and ¶ --.

UNITED STATES PATENT AND TRADEMARK OFFICE
CERTIFICATE OF CORRECTION

PATENT NO. : 6,149,986
DATED : November 21, 2000
INVENTOR(S) : Makoto Shibata et al.

It is certified that error appears in the above-identified patent and that said Letters Patent is hereby corrected as shown below:

Column 30,
Line 4, "claim 1" should read -- claim 1, --;
Line 10, "layer" (first occurrence) should be deleted;
Line 13, "electrodes" should read -- second wiring layer --;
Line 15, "claim 1" should read -- claim 1, --;
Line 18, "claim 1" should read -- claim 1, --;

Signed and Sealed this

Thirteenth Day of November, 2001

*Attest:*

Nicholas P. Godici

NICHOLAS P. GODICI

*Attesting Officer*

*Acting Director of the United States Patent and Trademark Office*